United States Patent
Tanaka et al.

(10) Patent No.: US 9,934,459 B2
(45) Date of Patent: Apr. 3, 2018

(54) TRANSPONDER AND BOOKLET

(75) Inventors: Junsuke Tanaka, Tokyo (JP); Akihisa Yamamoto, Tokyo (JP); Makoto Maehira, Asaka (JP); Yoshiyuki Mizuguchi, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 453 days.

(21) Appl. No.: 12/735,584

(22) PCT Filed: Oct. 10, 2008

(86) PCT No.: PCT/JP2008/068492
§ 371 (c)(1),
(2), (4) Date: Jul. 29, 2010

(87) PCT Pub. No.: WO2009/104303
PCT Pub. Date: Aug. 27, 2009

(65) Prior Publication Data
US 2011/0002107 A1    Jan. 6, 2011

(30) Foreign Application Priority Data

Feb. 22, 2008 (JP) .................................. 2008-041134
Jul. 18, 2008 (JP) .................................. 2008-187007

(51) Int. Cl.
*G06K 19/07* (2006.01)
*G06K 19/077* (2006.01)
*G06K 19/02* (2006.01)

(52) U.S. Cl.
CPC ..... *G06K 19/07749* (2013.01); *G06K 19/025* (2013.01); *G06K 19/077* (2013.01);
(Continued)

(58) Field of Classification Search
CPC .............. G06K 19/07; G06K 19/0707; G06K 19/0708; G06K 19/0709; G06K 19/0723;
(Continued)

(56) References Cited

U.S. PATENT DOCUMENTS 4,202,445 A * 5/1980 Porter .............................. 206/37
4,697,698 A * 10/1987 Holdener ...................... 206/39.4
(Continued)

FOREIGN PATENT DOCUMENTS

EA    006884    4/2006
EP    0706152   4/1996
(Continued)

OTHER PUBLICATIONS

Australian Office Action dated May 12, 2011 in corresponding Australian Patent Application 2008351057.
(Continued)

*Primary Examiner* — Daniel Walsh
(74) *Attorney, Agent, or Firm* — Staas & Halsey LLP

(57) ABSTRACT

A transponder includes an inlet including an antenna sheet, which includes an antenna coil on a flexible first base material, and an IC module connected to the antenna coil, and a second base material, which has an opening for exposing at least a part of the IC module and is bonded to the inlet; a sealing material having electrical insulation is provided between the IC module and an inside face of the opening.

20 Claims, 15 Drawing Sheets

(52) U.S. Cl.
CPC .................. *G06K 19/07745* (2013.01); *H01L 2224/45144* (2013.01); *H01L 2224/48091* (2013.01); *H01L 2924/01015* (2013.01); *H01L 2924/01019* (2013.01); *H01L 2924/01047* (2013.01); *H01L 2924/181* (2013.01)

(58) Field of Classification Search
CPC ........... G06K 19/077; G06K 19/07722; G06K 19/07728; G06K 19/07747; G06K 19/07749; G06K 19/07775; G06K 19/025; H01L 23/28; H01Q 1/2283; H05K 3/46; H05K 2201/10098; B32B 2519/02

See application file for complete search history.

(56) References Cited

U.S. PATENT DOCUMENTS

| | | | |
|---|---|---|---|
| 4,769,915 A * | 9/1988 | Nelson | 353/25 |
| 4,797,767 A * | 1/1989 | Baus, Jr. | 360/121 |
| 4,990,759 A * | 2/1991 | Gloton et al. | 235/492 |
| 5,041,922 A * | 8/1991 | Wood et al. | 360/55 |
| 5,163,039 A * | 11/1992 | Lindmayer | 369/100 |
| 5,390,142 A * | 2/1995 | Gendlin | 365/145 |
| 5,506,008 A * | 4/1996 | Klumpp et al. | 427/515 |
| 5,537,281 A * | 7/1996 | Ma et al. | 360/133 |
| 5,633,767 A * | 5/1997 | Boutaghou et al. | 360/53 |
| 5,678,562 A * | 10/1997 | Sellers | 600/523 |
| 5,708,419 A * | 1/1998 | Isaacson et al. | 340/572.5 |
| 5,721,942 A * | 2/1998 | Nishiyama et al. | 710/301 |
| 5,791,461 A * | 8/1998 | Tsuge | 206/39.4 |
| 5,852,289 A * | 12/1998 | Masahiko | 235/492 |
| 5,961,613 A * | 10/1999 | DeNicola | 710/18 |
| 6,031,724 A * | 2/2000 | Takahashi | 361/737 |
| 6,303,471 B1 * | 10/2001 | Unno et al. | 438/464 |
| 6,786,419 B2 * | 9/2004 | Kayanakis | 235/492 |
| 6,886,246 B2 * | 5/2005 | Chung | 29/832 |
| 7,131,594 B2 * | 11/2006 | Ohta et al. | 235/492 |
| 7,377,446 B2 * | 5/2008 | Ohta | G06K 19/077 235/379 |
| 7,546,671 B2 * | 6/2009 | Finn | 29/592.1 |
| 8,232,630 B2 * | 7/2012 | Ohira et al. | 257/679 |
| 8,519,905 B2 * | 8/2013 | Tanaka et al. | 343/866 |
| 8,522,431 B2 * | 9/2013 | Finn | 29/841 |
| 8,653,636 B2 * | 2/2014 | Tanaka et al. | 257/676 |
| 2001/0052543 A1 * | 12/2001 | Liu et al. | 235/449 |
| 2002/0020900 A1 * | 2/2002 | Toth et al. | 257/678 |
| 2002/0074246 A1 * | 6/2002 | Tiscione et al. | 206/39.4 |
| 2002/0108883 A1 * | 8/2002 | Levin et al. | 206/39.4 |
| 2002/0121685 A1 * | 9/2002 | Higuchi | 257/679 |
| 2002/0170974 A1 * | 11/2002 | Kashima | G06K 19/005 235/492 |
| 2002/0179721 A1 * | 12/2002 | Elbaz et al. | 235/492 |
| 2002/0185744 A1 * | 12/2002 | Katagiri et al. | 257/777 |
| 2002/0190132 A1 * | 12/2002 | Kayanakis | 235/492 |
| 2003/0024995 A1 * | 2/2003 | Conner et al. | 235/492 |
| 2003/0067715 A1 * | 4/2003 | Niitsuma et al. | 360/133 |
| 2004/0008498 A1 * | 1/2004 | Tanaka et al. | 361/764 |
| 2004/0041262 A1 * | 3/2004 | Okamoto et al. | 257/737 |
| 2004/0159709 A1 * | 8/2004 | Ohta et al. | 235/492 |
| 2004/0169086 A1 * | 9/2004 | Ohta et al. | 235/492 |
| 2004/0203185 A1 * | 10/2004 | Kerr et al. | 438/106 |
| 2005/0066513 A1 * | 3/2005 | Kayanakis | B32B 37/02 29/592.1 |
| 2005/0101060 A1 * | 5/2005 | Tsunoda | G06K 19/07728 438/127 |
| 2005/0140512 A1 * | 6/2005 | Sakama | G06K 7/10178 340/572.7 |
| 2005/0224149 A1 * | 10/2005 | Tiscione | 150/148 |
| 2006/0005050 A1 * | 1/2006 | Basson et al. | 713/194 |
| 2006/0097877 A1 * | 5/2006 | Baba et al. | 340/572.4 |
| 2006/0103536 A1 * | 5/2006 | Kwak et al. | 340/572.7 |
| 2006/0189031 A1 * | 8/2006 | Kado et al. | 438/108 |
| 2006/0285301 A1 * | 12/2006 | Provost et al. | 361/737 |
| 2007/0007344 A1 * | 1/2007 | Inoue et al. | 235/435 |
| 2007/0182154 A1 * | 8/2007 | Hoeppner et al. | 283/72 |
| 2008/0072423 A1 * | 3/2008 | Finn | 29/854 |
| 2008/0117049 A1 * | 5/2008 | Ogata | G06K 19/07722 340/572.1 |
| 2008/0150817 A1 * | 6/2008 | Carre | H01Q 1/38 343/741 |
| 2008/0180217 A1 * | 7/2008 | Isabell | H01Q 1/2225 340/10.1 |
| 2009/0008142 A1 | 1/2009 | Shimizu et al. | |
| 2009/0101255 A1 * | 4/2009 | Long | 150/147 |
| 2009/0315320 A1 * | 12/2009 | Finn | B32B 37/1207 283/107 |
| 2010/0015760 A1 * | 1/2010 | Kado et al. | 438/113 |
| 2010/0102431 A1 * | 4/2010 | Atsumi | 257/690 |
| 2010/0193591 A1 * | 8/2010 | Rancien et al. | 235/488 |
| 2010/0200661 A1 * | 8/2010 | Shafran | G06K 19/07745 235/492 |
| 2010/0277382 A1 * | 11/2010 | Tanaka | G06K 19/07749 343/741 |
| 2010/0295286 A1 * | 11/2010 | Goldstein | B42D 3/12 281/29 |
| 2011/0002107 A1 * | 1/2011 | Tanaka et al. | 361/762 |
| 2011/0012159 A1 * | 1/2011 | Yamada et al. | 257/98 |
| 2011/0169146 A1 * | 7/2011 | Ohira | G06K 19/07728 257/666 |
| 2012/0193774 A1 * | 8/2012 | Tanaka et al. | 257/676 |
| 2012/0248201 A1 * | 10/2012 | Sutera | 235/492 |
| 2015/0269471 A1 * | 9/2015 | Finn | H05K 3/46 235/492 |
| 2016/0104064 A1 * | 4/2016 | Mizoguchi | G06K 19/07775 257/531 |

FOREIGN PATENT DOCUMENTS

| | | | | |
|---|---|---|---|---|
| EP | 766197 A1 * | 4/1997 | | G06K 19/00 |
| JP | 01160886 A * | 6/1989 | | C04B 41/64 |
| JP | 04336299 A * | 11/1992 | | B42D 15/10 |
| JP | 08-216573 | 8/1996 | | |
| JP | 10-166771 | 6/1998 | | |
| JP | 11073484 A * | 3/1999 | | G06K 19/077 |
| JP | 2000-155820 | 6/2000 | | |
| JP | 2000-200335 | 7/2000 | | |
| JP | 2000-222546 | 8/2000 | | |
| JP | 2001101372 A * | 4/2001 | | G06K 19/07 |
| JP | 2002-042068 | 2/2002 | | |
| JP | 2002-197433 | 7/2002 | | |
| JP | 2002-334309 | 11/2002 | | |
| JP | 2004-171312 | 6/2004 | | |
| JP | 2005-084931 | 3/2005 | | |
| JP | 2005-178234 | 7/2005 | | |
| JP | 3721520 | 9/2005 | | |
| JP | 2005-313520 | 11/2005 | | |
| JP | 2005346559 A * | 12/2005 | | G06K 19/077 |
| JP | 2007-058667 | 3/2007 | | |
| JP | 2007-121815 | 5/2007 | | |
| JP | 2007-310472 | 11/2007 | | |
| JP | 2008-207431 | 9/2008 | | |
| JP | 2008263427 A * | 10/2008 | | |
| RU | 2158204 | 10/2000 | | |
| RU | 2165660 C2 | 4/2001 | | |
| RU | 2205453 C2 | 5/2003 | | |
| RU | 2257614 | 7/2005 | | |
| RU | 2005141527 | 7/2007 | | |
| TW | 200424946 | 11/2004 | | |
| TW | 200521870 | 7/2005 | | |
| WO | 2005/104024 A1 | 11/2005 | | |
| WO | WO 2006/030785 | 3/2006 | | |
| WO | 2007/097249 | 8/2007 | | |

OTHER PUBLICATIONS

Russia Office Action dated Dec. 19, 2011 issued in corresponding Russian Patent Application No. 2010134567/08(049041).
Taiwan Office Action dated Apr. 26, 2012 issued in corresponding Taiwan Patent Application No. 097139127.

(56) References Cited

OTHER PUBLICATIONS

European Office Action dated Jan. 20, 2014 in European Application No. 08872646.8-1806.
Japanese Notice of Reasons for Rejection dated Jan. 22, 2013 Japanese Patent Application No. 2009-554189.
Russian Notice of Allowance dated May 21, 2012 issued in corresponding Russian Patent Application No. 2010134567.

* cited by examiner ial can prevent infiltration of external substances such as air and water, thereby preventing external substances such as water from adversely affecting the IC module.

TRANSPONDER AND BOOKLET

CROSS REFERENCE TO RELATED APPLICATIONS

This application claims the benefit under 35 U.S.C. Section 371, of PCT International Application NO. PCT/JP2008/068492, filed Oct.10, 2008, which claimed priority to Japanese Patent Application No. 2008-041134, filed Feb. 22, 2008, and Japanese Patent Application No. 2008-187007, filed Jul.18, 2008, the contents of which are incorporated herein by reference.

BACKGROUND ART

There are conventionally known technologies for arranging a wire-wound antenna coil on a substrate and connecting it to an IC module to form a non-contact type communication unit which performs data communications with an external reading/writing device (e.g. see Patent Document 1).

In recent years, systems using non-contact IC card and non-contact IC tags are being used with the aim of enhancing security. To apply the excellent characteristics of such non-contact IC cards, IC tags, and the like in a booklet, such as a passport and a savings passbook, it is proposed to form a non-contact type information medium by pinching an IC inlet, with an antenna that is connected to a non-contact IC module, between outer-cover base materials, and mounting the medium on the booklet by bonding it to a front cover or the like thereof.

Since such a booklet enables electronic data to be entered to the IC inlet and printed, enhanced security characteristics and the like can be achieved.

Patent Document 2 discloses one example of a booklet such as that described above. In this booklet, a non-contact type information medium is bonded to an inner face of a back cover of the booklet. The non-contact type information medium is configured such that, on a top-face side of a first base-material sheet, a second base-material sheet having an opening of a predetermined width is affixed to form a recess, an IC chip and an antenna coil attached thereto are provided in this recess, and an adhesive layer is provided on a bottom-face side of the first base-material sheet.

Patent Document 1: Japanese Patent No. 3721520
Patent Document 2: Japanese Patent Application, First Publication No. 2002-42068

DISCLOSURE OF THE INVENTION

Problems to be Solved by the Invention

However, in the conventional technology described above, when bonding an insulating base material and the like to an inlet wherein an IC module is mounted on an antenna sheet including an antenna coil, the bonded base material swells due to the thickness of a sealing resin section where an IC chip is sealed. Accordingly, as shown in FIG. 20, in a conventional inlay 400, a base material 42 including an opening 42h corresponding to a sealing resin section 23 is bonded to an inlet 30 including an IC module 20 mounted on an antenna sheet 1, and the sealing resin section 23 is stored and exposed in the opening 42h of the base material 42.

When a gap D forms between the sealing resin section 23 and the inside face of the opening 42h, there is a problem that a part of the wiring or the like of the inlet 30 is exposed in the opening 42h, and static electricity intrudes. When static electricity intrudes into a part of the wiring of the inlet 30, there is a danger of adversely affecting the IC module 20.

To prevent formation of such a gap D, it is considered to use a material that is flexible and pliable as the base material 42, make the outer shape of the opening 42h smaller than the outer shape of the sealing resin section 23, and press the sealing resin section 23 into the opening 42h.

However, while this can prevent generation of the gap D, there is a danger that, in pressing the sealing resin section 23 into the opening 42h, the external force will break the IC module 20. Also, when the sealing resin section 23 is pressed into the opening 42h, a part of the base material 42 rises onto the sealing resin section 23, and there is a danger that external force during a stamp test and the like will break the IC module 20.

Therefore, to store and expose the sealing resin section 23 of the IC module 20 in the opening 42h, the outer shape of the opening 42h must be made larger than the outer shape of the sealing resin section 23. This makes it difficult to prevent generation of the gap D.

Furthermore, since the inlay 400 is required to have a flat outer surface, it is subjected to a flatness test such as a ball-pen test. If a catch is generated at the gap D, or if a step g forms between an outer surface 42a of the base material 42 and an outer face 20a of the IC module 20, there are cases where the inlay 400 cannot satisfy the standard for passing the test.

Furthermore, many conventional booklets such as that described above are made using paper and the like. Since chloride ions, water, and the like can easily permeate through paper, permeation of such substances sometimes leads to deterioration of the antenna and the like of the bonded non-contact type information medium. As a result, there is an adverse affect on the durability of the non-contact type information medium, leading to problems such as a possibility of a decline in the performance of the non-contact type information medium while the booklet is being used.

Accordingly, this invention provides an inlay, an inlay with cover, and a data carrier with non-contact type IC, that can prevent infiltration of static electricity and satisfy the demand for flat outer surfaces.

Means for Solving the Problem

To solve the problems mentioned above, a transponder of the present invention includes an inlet including an antenna sheet, which includes an antenna coil on a flexible first base material, and an IC module connected to the antenna coil, and a second base material, which has an opening for exposing at least a part of the IC module and is bonded to the inlet. The transponder includes a sealing material having electrical insulation being provided between the IC module and an inside face of the opening.

With this configuration, even when the outer shape of the opening is larger than the outer shape of the section of the IC module that is exposed in the opening, generating a gap between the inside face of the opening and the IC module, the insulating sealing material can fill in this gap. Therefore, it is possible to prevent externally generated static electricity from infiltrating through this gap, thereby preventing externally generated static electricity from adversely affecting the IC module. Moreover, even when exposed to a high-temperature environment or medical solutions, the sealing material can prevent infiltration of external substances such as air and water, thereby preventing external substances such as water from adversely affecting the IC module.

Since the gap between the inside face of the opening and the IC module exposed in the opening is filled in using the sealing material, a catch at the gap during a flatness test such as a ball pen test can be prevented, making it possible to enhance the flatness and smoothness of the outer surface of the transponder.

The sealing material of the transponder according to the present invention is arranged such as to cover the outer surface of the IC module exposed in the opening, and is formed such that an outer surface of the second base material and an outer surface of the sealing material are continuous and roughly flat.

With this configuration, even if a step is generated between the outer surface of the second base material and the outer surface of the IC module exposed in the opening, since the outer surface of the second base material and the outer surface of the sealing material is formed roughly flat, the outer surface of the transponder can be made flat. Therefore, the flatness and smoothness of the outer surface of the transponder can be increased.

In the transponder according to the present invention, a step between the outer surface of the second base material and the outer surface of the sealing material is no larger than 20 μm.

With this configuration, the outer surface of the transponder can be formed roughly flat and roughly in the same plane, and can adequately satisfy the standard for passing a flatness test, such as a ball pen test.

In the transponder according to the present invention, the sealing material is formed such as to cover a connection section between the antenna coil and the IC module, and a jumper line that connects the antenna coil to the IC module.

With this configuration, a connection section between the antenna coil and the IC module can be reinforced, thereby increasing the mechanical strength and the reliability of the connection section.

In the transponder according to the present invention, the IC module includes a lead frame, an IC chip mounted on the lead frame, and a sealing resin section which seals the IC chip, and the longitudinal elastic modulus of the sealing material is less than the longitudinal elastic modulus of the sealing resin section.

With this configuration, a shock applied against the transponder is dispersed into the sealing material as elastic energy. Consequently, the shock against the IC module can be reduced.

Furthermore, the sealing material elastically deforms more easily than the sealing resin section of the IC module. Therefore, in a ball pen test, even if an external force received from the pen tip by the outer surface of the second base material makes a deformed indentation on the inlet side of the outer surface of the sealing material, when the pen tip moves from being on the outer surface of the second base material to being on the outer surface of the sealing material, the sealing material elastically deforms in a direction that reduces the step between the outer surface of the second base material and the outer surface of the sealing material (the inlet direction). This can reduce stress in the direction which the pen tip is proceeding in due to the step between the outer surface of the second base material and the outer surface of the sealing material.

The sealing material of the transponder according to the present invention is a resin tape including a sticky material and a support.

With this configuration, the arrangement of the sealing material can be facilitated, the manufacturing step of the transponder can be simplified, and the manufacturing cost can be reduced.

The IC module of the transponder according to the present invention includes a lead frame, an IC chip mounted on the lead frame, and a sealing resin section which seals the IC chip; and the longitudinal elastic modulus of at least one of the sticky material and the support is less than the longitudinal elastic modulus of the sealing resin section.

With this configuration, a shock applied against the transponder is dispersed into the sealing material as elastic energy. Consequently, the shock against the IC module can be reduced.

Furthermore, the sealing material elastically deforms more easily than the sealing resin section of the IC module. Therefore, in a ball pen test, even if an external force received from the pen tip by the outer surface of the second base material makes a deformed indentation on the inlet side of the outer surface of the sealing material, when the pen tip moves from being on the outer surface of the second base material to being on the outer surface of the sealing material, the sealing material elastically deforms in a direction that reduces the step between the outer surface of the second base material and the outer surface of the sealing material (the inlet direction).

Consequently, it is possible to reduce stress in the direction which the pen tip is proceeding in due to the step between the outer surface of the second base material and the outer surface of the sealing material.

In the transponder according to the present invention, the first base material is a cover material.

With this configuration, it becomes possible to provide a transponder with cover wherein infiltration of static electricity is prevented, and which has a flatter and smoother outer surface. Furthermore, by using a cover material as the first base material, the transponder with cover can be made thinner than one in which a cover is joined to the outer surface of the first base material.

In the transponder according to the present invention, a cover is joined to at least one of the outer surface of the first base material and the outer surface of the second base material.

With this configuration, it is possible to provide a transponder with cover wherein infiltration of static electricity is prevented, and which has a flatter outer surface.

In the transponder according to the present invention, the antenna sheet and the sealing material are molded in a single piece.

With this configuration, static electricity generated outside the transponder can be prevented from infiltrating through a gap between the antenna sheet and the sealing agent, whereby externally generated static electricity can be prevented from adversely affecting the IC module.

The transponder according to the present invention includes a chloride ion-resistant layer formed such as to cover at least one or more of the antenna coil, the IC module, and a jumper line that connects the antenna coil to the IC module.

With this configuration, deterioration of any of the antenna coil, the IC module, and the jumper line due to chloride ions from outside the transponder can be prevented.

The transponder according the present invention includes a water-resistant layer formed such as to cover at least one or more of the antenna coil, the IC module, and a jumper line that connects the antenna coil to the IC module.

With this configuration, deterioration of any of the antenna coil, the IC module, and the jumper line due to water from outside the transponder can be prevented.

A booklet according to the present invention includes a transponder including an inlet including an antenna sheet, which includes an antenna coil on a flexible first base material, and an IC module connected to the antenna coil, and a second base material, which has an opening for exposing at least a part of the IC module and is bonded to the inlet. A sealing material having electrical insulation is provided between the IC module and an inside face of the opening.

EFFECT OF THE INVENTION

According to the present invention, it is possible to provide a transponder and a booklet that can prevent infiltration of static electricity, and can satisfy a demand for a flat outer surface.

REFERENCE SYMBOLS

Figure 1A:
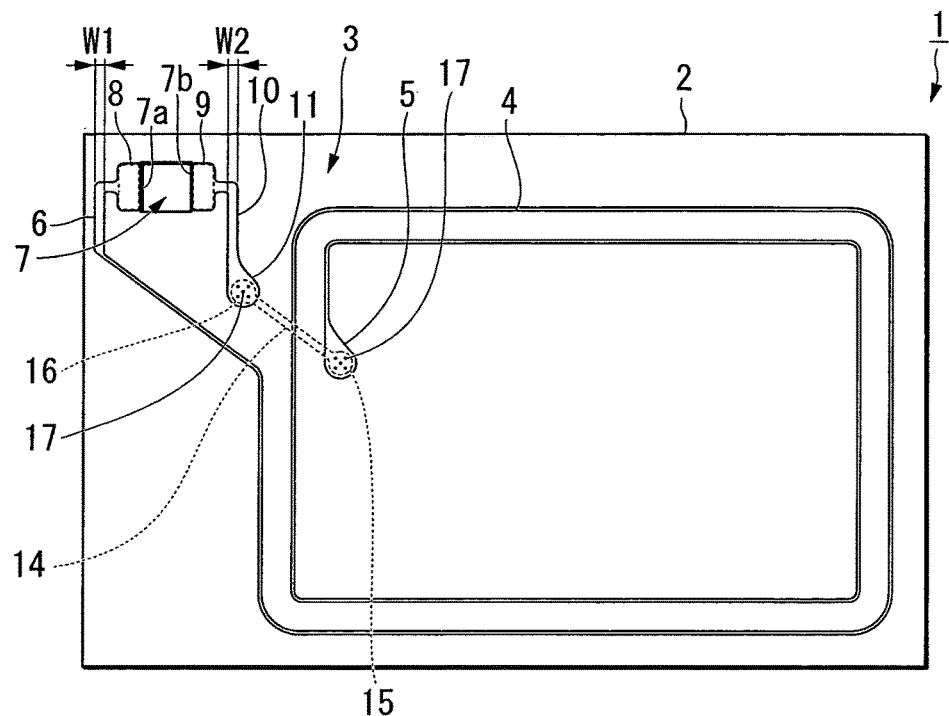
FIG. 1A is a plan view of an antenna sheet according to a first embodiment of the present invention.

1 Antenna sheet
2 Substrate (First base material)
4 Antenna coil
20 IC module
20a Outer surface
21 Lead frame
22 IC chip
23 Sealing resin section
30 Inlet
40, 40B, 40C, 40D, 40E Inlay
42 Base material (Second base material)
42a Outer surface
42h, 42H Opening
43 Sealing material
43a Outer surface
44 Cover material
50 Sealing material
51 Adhesive
100 Electronic passport (inlay with cover, data carrier with non-contact type IC)
101, 101A Booklet
110, 110A Non-contact type information medium
112 Sheet
112A Through hole
113 Antenna coil
114 IC chip
115 Porous base materials
116 Adhesive (chloride ion-resistant layer)

BEST MODE FOR CARRYING OUT THE INVENTION

<First Embodiment>

Subsequently, a first embodiment of the invention will be explained based on the drawings.

Figure 1B:
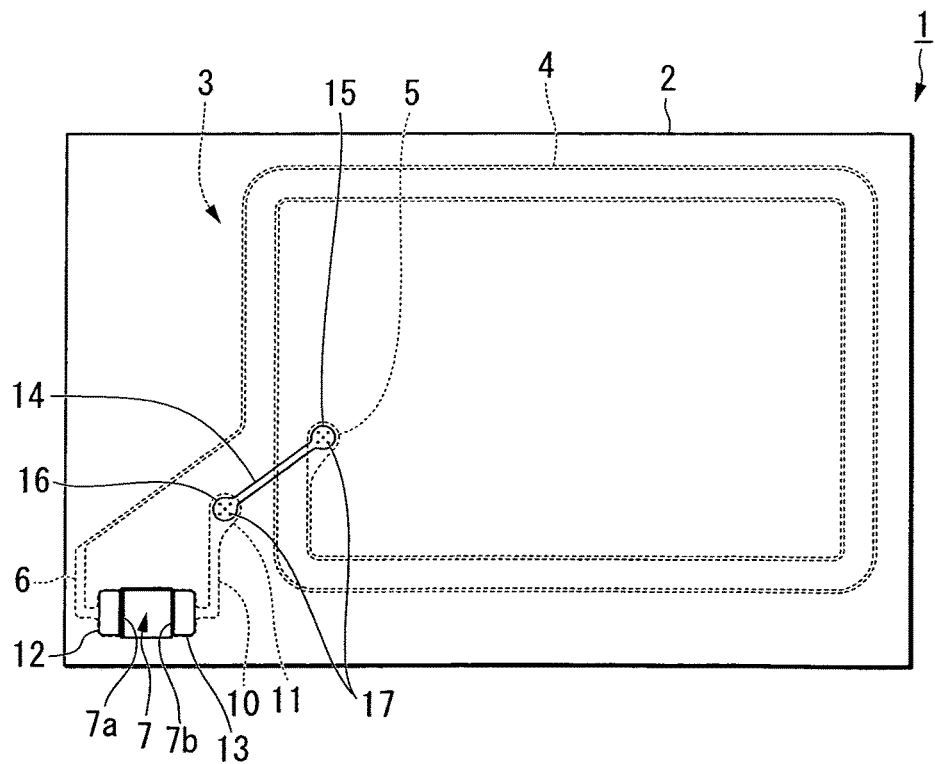
FIG. 1B is a bottom view of an antenna sheet according to the first embodiment of the present invention.

FIG. 1A is a plan view of an antenna sheet 1 according to this embodiment, and FIG. 1B is a bottom view. As shown in FIG. 1A, the antenna sheet 1 includes a flexible substrate (first base material) 2 formed from, for example, polyethylene naphthalate (PEN) or polyethylene terephthalate (PET). The thickness of the substrate 2 is selected as appropriate from a range of, for example, approximately 0.02 mm to approximately 0.10 mm. An antenna circuit 3 is formed on a surface of the substrate 2.

The antenna circuit 3 includes an antenna coil 4 formed in a roughly rectangular spiral shape that corresponds to the shape of the substrate 2. The antenna coil 4 is made by performing etching and the like to pattern an aluminum thin film formed on a surface of the substrate 2, and is formed in a thin-film shape having a thickness of approximately 0.02 mm to 0.05 mm. An inside end of the antenna coil 4 expands in volume in a roughly circular shape, forming a terminal section 5. Bent portions (rectangle corners) of the antenna coil 4 are formed in roughly circular arc shapes.

An outside end 6 of the antenna coil 4 is led toward one corner of the substrate 2. A roughly rectangular opening 7 is formed slightly to the antenna coil 4 side of one corner of the substrate 2. The opening 7 can store and expose a part of an IC module explained later.

The outside end 6 of the antenna coil 4 that is led toward one corner of the substrate 2 is led toward one side 7a of the opening 7, and is connected to an antenna connecting land 8 (connection section) which is formed along the side 7a. The antenna connecting land 8 is a roughly rectangular terminal section formed by increasing the width W1 of the antenna coil 4.

An antenna connecting land 9 (connection section) is formed on one side 7b of the opening 7 that opposes the side 7a where the antenna connecting land 8 is formed. A wire 10 is one part of the antenna coil 4, and is connected to the antenna connecting land 9 opposing the antenna connecting land 8. In a manner similar to the opposing antenna connecting land 8, the antenna connecting land 9 is formed in a roughly rectangular shape along the side 7b of the opening 7 by increasing the width W2 of the wire 10. One end of the wire 10 connects to the antenna connecting land 9, and another end side increases in volume in a roughly circular shape to form a terminal section 11.

As shown in FIG. 1B, reinforcing patterns 12 and 13 (reinforcing sections) for reinforcing the antenna connecting lands 8 and 9 are formed on a face on an opposite side to the face where the antenna circuit 3 is formed, in correspondence with the formation regions of the antenna connecting lands 8 and 9. The reinforcing patterns 12 and 13 are formed in rectangular shapes corresponding to the shapes of the antenna connecting lands 8 and 9 along the outlines of the antenna connecting lands 8 and 9 when viewed from above by, for example, etching and the like of a metal thin film as used for the antenna circuit 3, or by a similar method.

A jumper line 14 is formed on a face on the opposite side of the substrate 2 to the face where the antenna circuit 3 is formed, and connects the terminal section 5 of the antenna coil 4 to the terminal section 11. The jumper line 14 is formed using, for example, a similar method to that used for the antenna circuit 3. Both ends of the jumper line 14 are increased in volume in roughly circular shapes to form terminal sections 15 and 16. The terminal sections 15 and 16 of the jumper line 14 are provided in correspondence with the formation regions of the terminal section 5 and the terminal section 11 of the antenna coil 4 respectively. The terminal sections 15 and 16 of the jumper line 14 and the terminal sections 5 and 11 of the antenna coil 4 are electrically connected together in conductive sections 17, which are formed in a plurality of point-like shapes in the formation regions of the terminal sections 15 and 16.

Figure 2A:
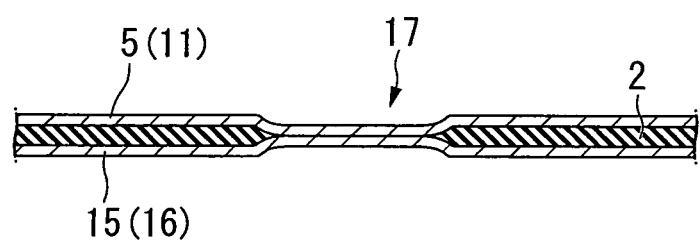
FIG. 2A is a cross-sectional view of a connection section between a jumper line and an antenna circuit of an antenna sheet according to the first embodiment of the present invention.

As shown in FIG. 2A, the conductive section 17 is for example formed by a crimping process of applying pressure to the terminal section 15 (terminal section 16) of the jumper line 14 and the terminal section 5 (terminal section 11) of the antenna coil 4 such as to pinch them from both sides, thereby breaking the substrate 2 and achieving physical contact between the terminal sections 5 and 15 (11 and 16).

Figure 2B:
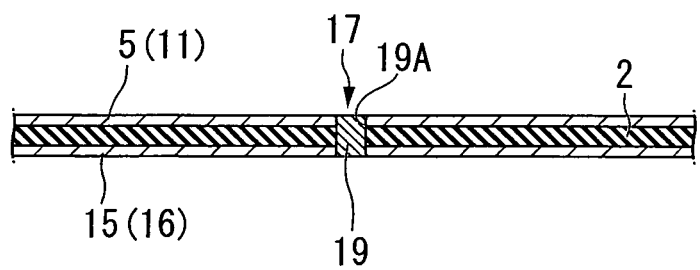
FIG. 2B is a cross-sectional view of a connection section between a jumper line and an antenna circuit of an antenna sheet according to the first embodiment of the present invention.

The conductive section 17 can be formed using a method other than connection by the crimping process described above; as shown in FIG. 2B, for example, it is acceptable to form a through hole 19A that penetrates the formation regions of the terminal sections 5 and 15 (11 and 16), fill the through hole 19A with a conductive paste 19 such as silver paste, and electrically connect the terminal section 15 (terminal section 16) of the jumper line 14 to the terminal section 5 (terminal section 11) of the antenna coil 4.

(IC Module)

Subsequently, an IC module 20 connected to the antenna circuit 3 of the antenna sheet 1 will be explained.

Figure 3A:
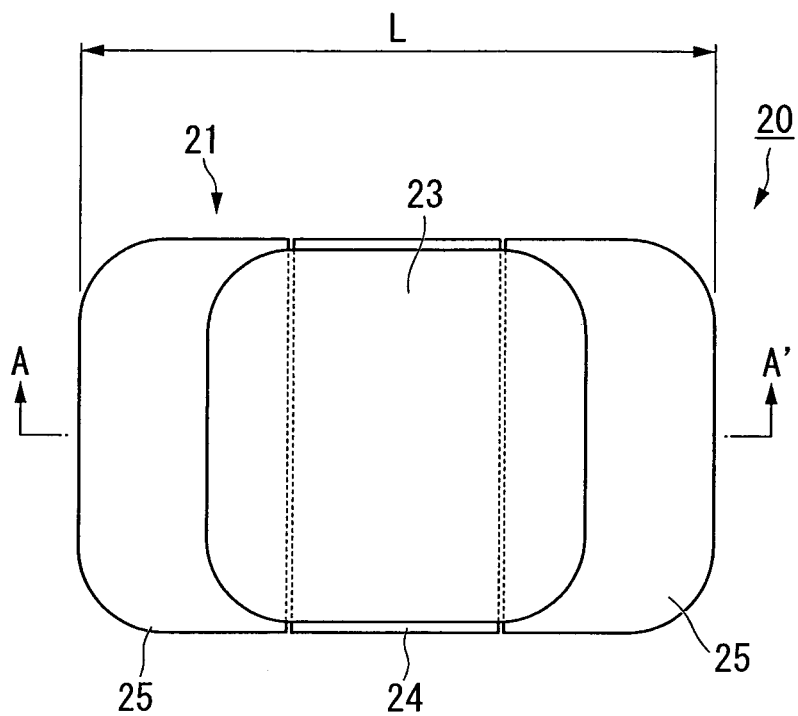
FIG. 3A is a plan view of an IC module according to the first embodiment of the present invention.
Figure 3B:
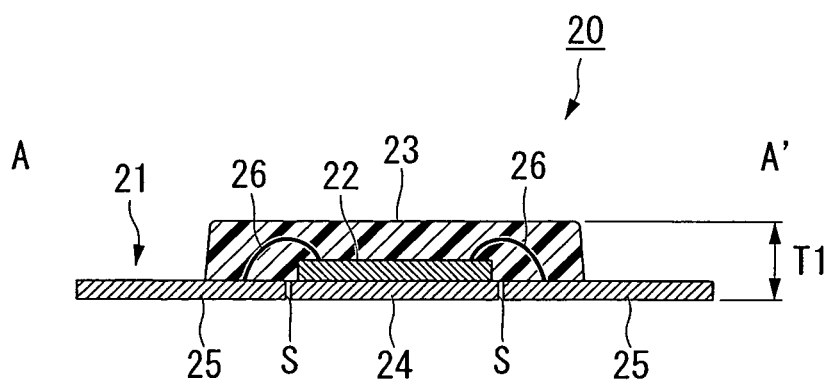
FIG. 3B is a cross-sectional view along a line A-A' of an IC module according to the first embodiment of the present invention.

FIG. 3A is a plan view of an IC module 20 according to this embodiment, and FIG. 3B is a cross-sectional view along the line A-A' of FIG. 3A.

As shown in FIGS. 3A and 3B, the IC module 20 is formed from a lead frame 21, an IC chip 22 mounted on the lead frame 21, and a sealing resin section 23 that seals the IC chip 22.

The lead frame 21 is formed roughly in the shape of a rectangle with its corners rounded to circular arc shapes when viewed from above. The lead frame 21 is formed from, for example, a copper-thread metal film and the like made by weaving copper thread into a film and silver plating this film.

The lead frame 21 includes a die pad 24 that securely supports the IC chip 22, and an antenna land 25 (terminal section) that is connected to an input/output pad of the IC chip 22.

The die pad 24 is slightly larger than the outer shape of the IC chip 22, and is fixed to the bottom of the IC chip 22. A gap S is provided between the die pad 24 and the antenna land 25, electrically insulating them from each other.

The antenna land 25 is connected to the input/output pad of the IC chip 22 by bonding wires 26 made from, for example, gold (Au). Since the antenna land 25 is used as a terminal section of the IC module 20 that is connected to an external circuit, it is formed extending along the long direction (length L direction) of the IC module 20.

The sealing resin section 23 is formed roughly in the shape of a square with its corners rounded to circular arc shapes when viewed from above. The sealing resin section 23 is formed from, for example, a resin material such as epoxy resin, and covers the IC chip 22, the input/output pad of the IC chip 22, the bonding wires 26, the connection section between the antenna land 25 and the bonding wires 26, etc. The sealing resin section 23 is filled into the gap S between the die pad 24 and the antenna land 25, and extends across both of them. Here, the thickness T1 of the IC module 20 is, for example, approximately 0.3 mm.

(Inlet (Also Termed Transponder))

Figure 4A:
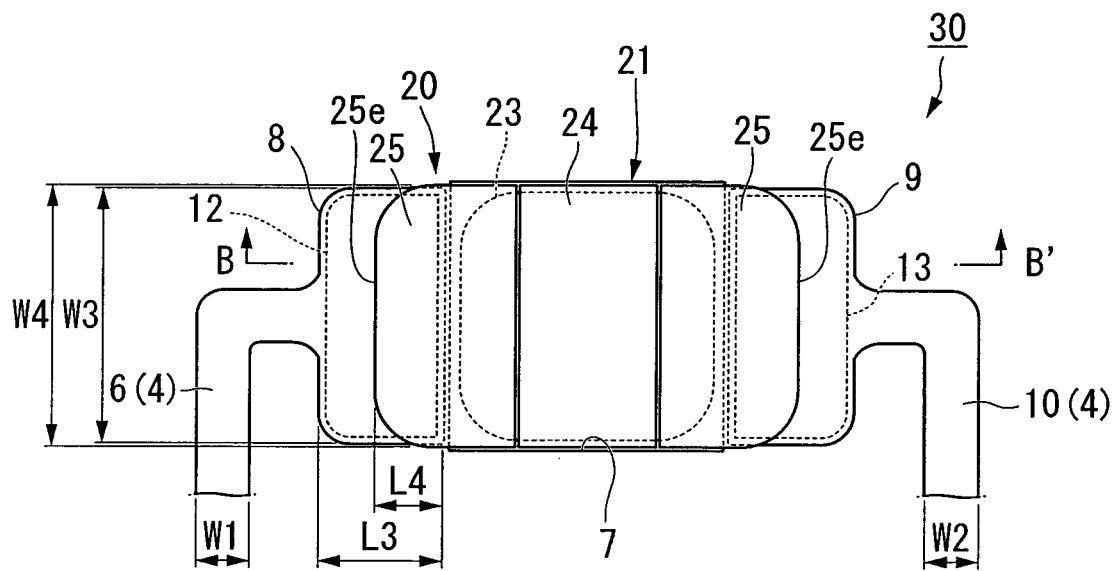
FIG. 4A is an enlarged plan view of an inlet according to the first embodiment of the present invention.
Figure 4B:
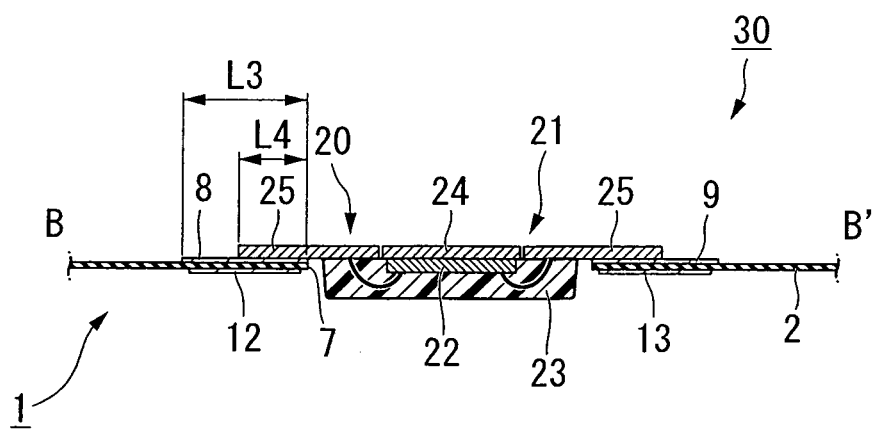
FIG. 4B is a cross-sectional view along a line B-B' of an inlet according to the first embodiment of the present invention.

As shown in FIGS. 4A and 4B, by electrically connecting the antenna land 25 of the IC module 20 to the antenna connecting lands 8 and 9 of the antenna sheet 1, and thereby securing the IC module 20 to the antenna sheet 1, there is formed an inlet 30 that includes the antenna sheet 1 and the IC module 20.

Here, the opening 7 of the antenna sheet 1 is opened in a roughly square shape corresponding to the sealing resin section 23, and slightly larger than the outer shape of the sealing resin section 23, enabling the opening 7 to store and expose the roughly square-shaped sealing resin section 23 of the IC module 20.

The widths W3 of the pair of antenna connecting lands 8 and 9 provided opposing each other on both sides of the opening 7 of the antenna sheet 1 are roughly the same as, or slightly smaller than, the width W4 of the antenna land 25 of the IC module 20.

The length L3 of the antenna connecting lands 8 and 9 of the antenna sheet 1 is larger than the length L4 of overlapping sections of the antenna land 25 of the IC module 20 and the antenna connecting lands 8 and 9. In this embodiment, the length L3 of the antenna connecting lands 8 and 9 is roughly twice the length L4 of the overlapping sections of the antenna land 25 and the antenna connecting lands 8 and 9.

(Inlay)

Subsequently, an inlay 40 including the inlet 30 described above will be explained using FIG. 5A and FIG. 5B. Not only the inlet 30 but also the inlay 40 including the inlet 30 will be termed 'transponder'.

Figure 5A:
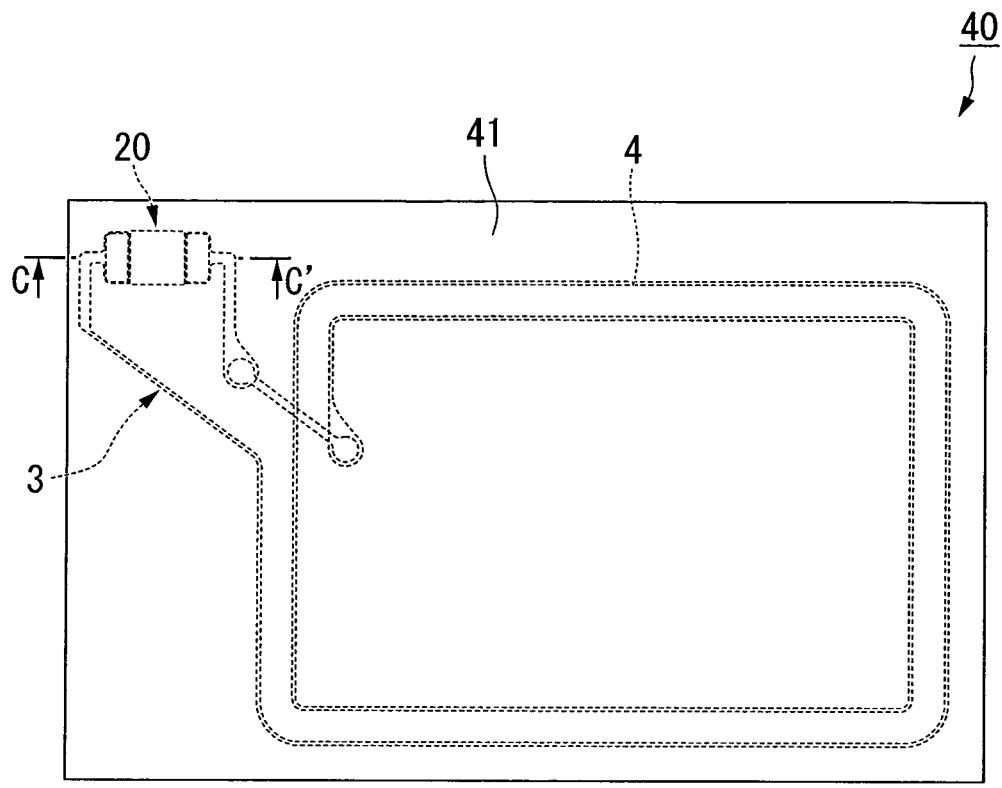
FIG. 5A is a plan view of an inlay according to the first embodiment of the present invention.
Figure 5B:
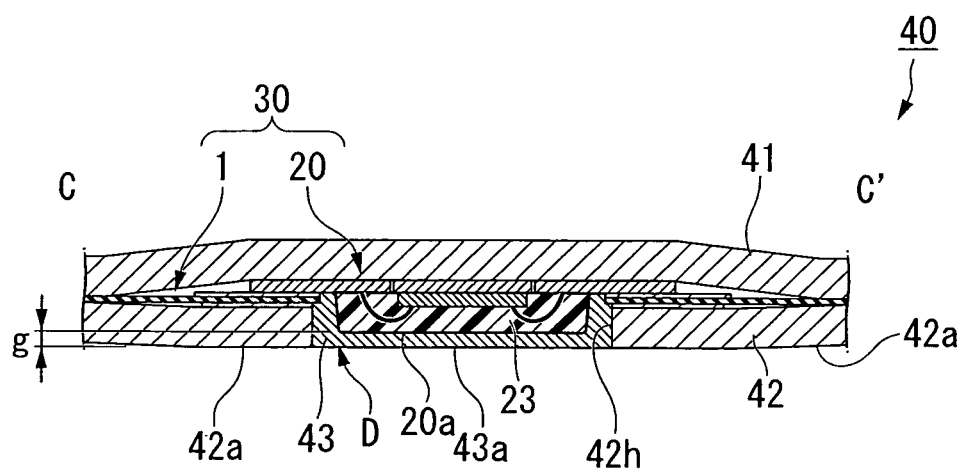
FIG. 5B is a partial cross-sectional view along a line C-C' of an inlay according to the first embodiment of the present invention.

As shown in FIGS. 5A and 5B, the inlay 40 of this embodiment includes the inlet 30, and base materials 41 and 42 (second base material) that pinch the inlet 30. The inlay 40 is formed with a desired thickness by pinching the inlet 30 between the base materials 41 and 42, and laminating them to join them into a single piece.

An adhesive containing a substance that is resistant to chloride ions can be applied to one or both of the face of the base material 41 that opposes the base material 42 and the face of the base material 42 that opposes the base material 41. With this configuration, chloride ions infiltrating the IC module 20 from the outside can be reduced.

As the base materials 41 and 42, for example, an insulating plastic film (PET-G: noncrystalline copolyester, PVC: vinyl chloride resin, etc.), or an insulating synthetic sheet (Teslin {Registered trademark}, a polyolefin synthetic sheet manufactured by PPG Industries), or Yupo {Registered trademark} a polypropylene synthetic sheet manufactured by Yupo Corporation) is used. Here, the plastic film is preferably a flexible plastic film.

The base materials 41 and 42 can have thicknesses of, for example, approximately 100 μm to approximately 1000 μm. Preferably, the thicknesses of the base materials 41 and 42 are in the range of approximately 100 μm to approximately 500 μm. Not only does this ensure that they function adequately as base materials in respect of strength and the like, it also gives the base materials 41 and 42 sufficient pliability to be applied in a booklet shape.

As shown in FIG. 5B, an opening 42h for storing the sealing resin section 23 and exposing its outer surface is formed in the base material 42. The outer shape of the opening 42h is slightly larger than the outer shape of the sealing resin section 23, and a gap D is formed between the inner face of the opening 42h and the sealing resin section 23. The opening 42h is filled with a sealing material 43 such as to cover the outer surface 20a of the IC module 20 including the outer surface of the sealing resin section 23 that is exposed in the opening 42h. The sealing material 43 is then arranged between the inside face of the opening 42h and the sealing resin section 23, and the gap D is filled in with the sealing material 43. Incidentally, a substance that is resistant to chloride ions can be used as the sealing material 43.

The sealing material 43 is formed such that the outer surface 42a of the base material 42 and the outer surface 43a of the sealing material 43 are continuous and roughly flat, with the outer surface 42a of the base material 42 and the outer surface 43a of the sealing material 43 being formed roughly in the same plane. In this embodiment, 'roughly flat' or 'roughly in the same plane' signify that the step between the outer surface 42a of the base material 42 and the outer surface 43a of the sealing material 43 is no larger than 20 μm.

The sealing material 43 is formed from, for example, an electrical insulating, heat-resistant, and moisture-resistant resin material. It is possible to use a polyester-based resin, a polypropylene-based resin, a polyethylene-based resin, a polystyrene-based resin, or a polyimide resin, and it is particularly preferable to use a biaxially oriented polyester resin. It is also possible to use an adhesive such as epoxy resin.

It is desirable that the permittivity of the sealing material 43 is, for example, approximately 1 to approximately $5\epsilon_S$.

A resin tape including a sticky material and a tape support made from the materials mentioned above can be used as the sealing material 43. When using a resin tape, the thickness of the resin tape is preferably, for example, approximately 25 μm to approximately 100 μm. When the thickness of the resin tape is below this range, its sealing effects deteriorate; when the thickness is above this range, there is a danger that a step will be formed.

When using a resin material as the sealing material 43, the resin material should preferably have a less longitudinal elastic modulus than the sealing resin section 23 of the IC module 20. Furthermore, when using a resin tape as the sealing material 43, the longitudinal elastic modulus of at least one of the support and the sticky material constituting the resin tape is preferably less than the longitudinal elastic modulus of the sealing resin section 23 of the IC module 20.

Though not shown here, an opening or a recess can be provided in the base material 41 at a position corresponding to lead frame 21. With this configuration, when bonding the base materials 41 and 42, the lead frame 21 can be stored in the opening or the recess, eliminating projections and recesses in the base material 41 due to the thickness of the lead frame 21. Also, since no gap is generated by the thickness of the lead frame 21, the inlay 40 can be thinner and its thickness can be made uniform. Furthermore, local stress is prevented, and resistance to flexing is increased. Moreover, the IC module can be fixed by storing the lead frame in the opening and in the recess.

The opening in the base material 41 can be formed by a method such as punching. After bonding the base materials 41 and 42, the opening in the base material 41 can be sealed in a manner similar to the opening 42h in the base material 42. The same sealing material as that of the sealing material 43 can be used for the opening in the base material 41. It is also possible to use an adhesive such as a two-component curable epoxy resin. In particular, using a shock-resistant elastic epoxy resin can protect the IC module 20 from shock.

The recess in the base material 41 can be formed by hot-stamping, milling, embossing, etc.

Subsequently, effects of this embodiment will be explained.

As shown in FIG. 5B, in the inlay 40 of this embodiment, the outer shape of the opening 42h is slightly larger than the outer shape of the sealing resin section 23, and a gap D is formed between the inside face of the opening 42h and the sealing resin section 23. A sealing material 43 having electrical insulation is provided such as to fill in this gap D. This can prevent external static electricity from infiltrating through the gap D and adversely affecting the IC module 20.

When the sealing material 43 is closely attached and covers the lead frame 21, which is the conductive section of the IC module 20 exposed by the gap D, a high insulating effect can be achieved. The joint strength between the IC module 20 and the antenna coil 4 is also increased.

When the gap D is filled in using the sealing material 43, this prevents a catch at the gap D during flatness test such as a ball pen test, and can increase the flatness and smoothness of the outer surface of the inlay 40 constituted by the outer surface 42a of the base material 42 and the outer surface 43a of the sealing material 43.

The sealing material 43 is arranged such as to cover the outer surface 20a of the IC module 20 exposed by the opening 42h, whereby the outer surface 42a of the base material 42 and the outer surface 43a of the sealing material 43 are joined such as to become roughly flat and roughly in the same plane. Consequently, even if a step g is generated between the outer surface 42a of the base material 42 and the outer surface 20a of the IC module 20 including the outer surface of the sealing resin section 23, the outer surface 42a of the base material 42 and the outer surface 43a of the sealing material 43 can be kept roughly in the same plane. It is therefore possible to increase the flatness and smoothness of the outer surface of the inlay 40 constituted by the outer surface 42a of the base material 42 and the outer surface 43a of the sealing material 43.

Furthermore, since the step between the outer surface 42a of the base material 42 and the outer surface 43a of the sealing material 43 is not larger than 20 μm, the outer surface of the inlay 40 constituted by the outer surface 42a of the base material 42 and the outer surface 43a of the sealing material 43 can between made roughly flat and in the same plane, and can adequately satisfy the standard for passing a flatness test, such as a ball pen test. More preferably, the step is not larger than 15 μm. This can reduce the defect rate in the ball pen test.

When using a resin tape as the sealing material 43, it becomes possible to facilitate the arrangement of the sealing material 43, simplify the manufacturing step of the inlay 40, increase the yield, and reduce the manufacturing cost.

When using, as the sealing material 43, a resin material having a less longitudinal elastic modulus than the sealing resin section 23 of the IC module 20, or a resin tape wherein at least one of the support and the sticky material has a less longitudinal elastic modulus than the sealing resin section 23 of the IC module 20, a shock applied against the inlay 40 is dispersed into the sealing material 43 as elastic energy. This reduces the shock against the IC module 20.

The sealing material 43 elastically deforms more easily than the sealing resin section 23 of the IC module 20. Therefore, in a ball pen test, even if an external force received from the pen tip by the outer surface 42a of the base material 42 makes a deformed indentation on the inlet 30 side of the outer surface 43a of the sealing material 43, when the pen tip moves from being on the outer surface 42a of the base material 42 to being on the outer surface 43a of the sealing material 43, the sealing material 43 elastically deforms in a direction that reduces the step between the outer surface 42a of the base material 42 and the outer surface 43a of the sealing material 43 (the inlet 30 direction). This can reduce stress in the direction which the pen tip is proceeding in due to the step between the outer surface 42a of the base material 42 and the outer surface 43a of the sealing material 43.

As described above, according to the inlay 40 of the present embodiment, infiltration of static electricity can be prevented, and the demand for a flat outer surface can be satisfied.

In this embodiment, when the inlet 30 shown in FIGS. 4A and 4B is subjected to repeated flexing, a section where the antenna land 25 of the IC module 20 is connected to the antenna connecting lands 8 and 9 of the antenna sheet 1 is subject to a stress due to repeated flexing. At this time, since the antenna coil 4 is formed by patterning of an aluminum thin film on the substrate 2, flexibility is increased in comparison with a conventional antenna coil formed from a wound wire, and stress is prevented from concentrating at specific points.

The width W3 of the antenna connecting lands 8 and 9 of the antenna coil 4 connected to the antenna land 25 of the IC module 20 is formed such that it is larger than the widths W1 and W2 of the antenna coil 4, and roughly the same as, or slightly smaller than, the width W4 of the antenna land 25. This can disperse the stress in the width W3 direction, and prevent it from concentrating. Furthermore, the antenna connecting lands 8 and 9 can be connected along the entire width of the antenna land 25 in the width W4 direction, and the antenna connecting lands 8 and 9 can be reliably connected to the antenna land 25, increasing the reliability of the antenna coil 4 and the inlet 30.

Furthermore, the length L3 of the antenna connecting lands 8 and 9 of the antenna sheet 1 is made larger than the length L4 of the overlapping sections between the antenna land 25 of the IC module 20 and the antenna connecting lands 8 and 9. Also, in this embodiment, the length L3 of the antenna connecting lands 8 and 9 is roughly twice the length L4 of the overlapping sections between the antenna land 25 and the antenna connecting lands 8 and 9. As a result, edges 25e of the antenna land 25 are connected such as to be positioned roughly at the center of the insides of the ends of the antenna connecting lands 8 and 9 on the antenna coil 4 side. The edges 25e of the antenna land 25 consequently contact roughly with the centers of the antenna connecting lands 8 and 9 whose width W3 is made larger than the widths W1 and W2 of the antenna coil 4.

Therefore, when the sections where the antenna land 25 of the IC module 20 is connected to the antenna connecting lands 8 and 9 of the antenna coil 4 are subjected to repeated flexing, the edges 25e of the antenna land 25 can be received roughly in the centers of the antenna connecting lands 8 and 9 whose width W3 is made larger. This can prevent concentration of stress in the antenna coil 4, and can thereby prevent breakage of the antenna coil 4.

In addition, since the antenna coil 4 and the antenna connecting lands 8 and 9 are formed on the substrate 2, the substrate 2 functions as a reinforcing material for them. This prevents the antenna coil 4 having small widths W1 and W2 from making contact with the edges 25e of the antenna land 25, and can prevent breakage of the antenna coil 4.

Furthermore, reinforcing patterns 12 and 13 for reinforcing the antenna connecting lands 8 and 9 are formed on a face of the substrate 2 that is on the opposite side to the face where the antenna circuit 3 is formed, in correspondence with the formation regions of the antenna connecting lands 8 and 9. The antenna connecting lands 8 and 9 are thus supported by both the substrate 2 and the reinforcing patterns 12 and 13 on the rear face of the substrate 2, whereby the antenna connecting lands 8 and 9 can be reinforced.

Therefore, the flexural strength of the antenna connecting lands 8 and 9 is increased, and, when the sections where the antenna land 25 of the IC module 20 is connected to the antenna connecting lands 8 and 9 of the antenna coil 4 are subjected to repeated flexing, breakage of the antenna connecting lands 8 and 9, and breakage of the antenna coil 4, can be prevented.

Even if the substrate 2 breaks due to stress, for example, the reinforcing patterns 12 and 13 can be made to contact the antenna connecting lands 8 and 9, whereby they can assist the antenna connecting lands 8 and 9, and prevent the antenna coil 4 from breaking.

Furthermore, since the thin-film antenna coil 4 of this embodiment can be manufactured collectively by, for example, etching and the like, in comparison with a manufacturing process in which wire-wound antenna coils are individually wired, productivity of the antenna sheet 1 can be noticeably increased.

Furthermore, when securing the IC module 20 on the substrate 2, since the opening 7 that can store the sealing resin section 23 of the IC module 20 is formed in the antenna sheet, the thickness of the sealing resin section 23 of the IC module 20 is absorbed by storing it in the opening 7 of the substrate 2, thereby enabling the inlet 30 to be made thin.

Furthermore, since the length L3 of the antenna connecting lands 8 and 9 is larger than the length of the antenna land 25 extending in the length L direction, the supporting area of the IC module 20 and the substrate 2 that is supported by the antenna connecting lands 8 and 9 can be increased. This increases durability against stress, and can prevent breakage of the antenna coil 4 even when the antenna connecting lands 8 and 9 are subjected to flexing.

Furthermore, the reinforcing patterns 12 and 13 are formed in formation regions of the antenna connecting lands 8 and 9 on a face of the substrate 2 of the antenna sheet 1 that is on the side opposite to the face where the antenna connecting lands 8 and 9 are formed. Consequently, heat during resistance welding can be transmitted to the reinforcing patterns 12 and 13, and released to the outside. This can prevent the substrate 2 from overheating and melting. Therefore, dirt can be prevented from sticking to the resistance welding apparatus and the product. In addition, a decrease in the flexural strength of the antenna sheet 1 can be prevented.

Furthermore, since the inlet 30 includes the antenna sheet 1 described above, breakage of the antenna coil 4 due to the antenna sheet 1 can be prevented, increasing the reliability of data communications, and further increasing the productivity of the inlet 30. Therefore, it is possible to provide the inlet 30 that enables breakage of the antenna coil 4 to be prevented, has high data communications reliability, and high productivity.

Furthermore, since the inlay 40 includes the inlet 30 including the antenna sheet 1 described above, breakage of the antenna coil 4 due to the antenna sheet 1 can be prevented, increasing the reliability of data communications, and further increasing the productivity. Also, the base materials 41 and 42 can reinforce connection points between the antenna connecting lands 8 and 9 of the antenna sheet 1 and the antenna land 25 of the IC module 20.

Therefore, it is possible to provide the inlay 40 that enables breakage of the antenna coil 4 to be prevented, has high data communications reliability, and high productivity.

(Inlay Manufacturing Method)

Subsequently, a method of manufacturing the inlay 40 of this embodiment will be explained.

Firstly, the inlet 30 is pinched between the pair of base materials 41 and 42, and joined to them. At this time, an opening 42h, which is slightly larger than the outer shape of the sealing resin section 23, is provided in one base material 42 at a position corresponding to the sealing resin section 23 of the IC module 20 of the inlet 30.

As a first manufacturing method, with the sealing resin section 23 of the IC module 20 stored and exposed in the opening 42h of the base material 42, the base materials 41 and 42 are joined to the inlet 30. The gap D between the sealing resin section 23 of the IC module 20 stored in the opening 42h and the inner face of the opening 42h is then filled with the sealing material 43. When using a resin tape, a hot metal sheet, and the like as the sealing material 43, this is filled into the gap D in a roughly rectangular frame shape when viewed from above, in correspondence with the shape of the gap D. At this time, after a pressing step described below, the quantity of the sealing material 43 is adjusted to an amount which ensures that the outer surface 42a of the base material 42 and the outer surface 43a of the sealing material 43 are roughly flat and in the same plane.

Subsequently, a pressing step of pressing the base materials 41 and 42 from their outer sides, pushing them together and compressing them, is performed. In this pressing step, the sealing material 43 in the base materials 41 and 42, and in the opening 42h, is compressed. In addition, the outer surface 42a of the base material 42 and the outer surface 34a of the sealing material 34 are formed roughly flatly and roughly in the same plane.

As a second manufacturing method, before joining the inlet 30 to the base materials 41 and 42, the sealing resin section 23 of an IC module 20 including the inlet 30 is covered with the sealing material 43, and the base materials 41 and 42 are then joined.

In this case, the portion of the IC module 20 of the inlet 30 that is exposed in the opening 42h is covered beforehand with the sealing material 43 made from a resin material such as a resin tape. The quantity of the resin material such as a resin tape at this time is adjusted in the same manner as in the first manufacturing method. When using a resin tape, it becomes possible to facilitate the arrangement of the sealing material 43, simplify the manufacturing step of the inlay 40, and to reduce the manufacturing cost.

Subsequently, as in the first manufacturing method, the base materials 41 and 42 are joined to the inlet 30. At this time, the sealing material 43 is filled into the opening 42h of the base material 42 and covers the sealing resin section 23. After performing the same pressing step as in the first manufacturing method, the outer surface 42a of the base material 42 and the outer surface 34a of the sealing material 34 are formed roughly flat and roughly in the same plane.

In the second manufacturing method, the base material 42 is preferably joined to the inlet 30 with the resin material in a semi-melted state. This enables the opening 42h to be more easily filled with the sealing material 43.

When using the synthetic sheet mentioned above as the base materials 41 and 42, the base materials 41 and 42 are joined to the inlet 30 by using an adhesive laminating method, whereby an adhesive is applied to the antenna sheet 1 of the inlet 30, or to the faces of the base materials 41 and 42 that will contact the antenna sheet 1, and they are joined at a comparatively low temperature of, for example, approximately 70° C. to 140° C.

As the adhesive, it is possible to use, for example, EVA (ethylene vinyl acetate resin)-based, EAA (ethylene-acrylic acid copolymer resin)-based, polyester-based, polyurethane-based, etc.

Instead of applying an adhesive coating, an adhesive sheet that uses the resin used in the adhesives mentioned above can be pinched between the antenna sheet 1 and the base materials 41 and 42.

When using the thermoplastic film mentioned above as the base materials 41 and 42, the inlet 30 is joined to the base materials 41 and 42 using a thermal laminating method of melt-bonding them by applying pressure to them while heating them at a temperature that exceeds the softening temperature of the base materials 41 and 42, e.g. approximately 130° C. to 170° C. To accomplish reliable melt-bonding, the adhesive mentioned above can also be used when employing a thermal laminating method.

After the inlet 30 is joined to the base materials 41 and 42 to form a single piece, the outer shape of this single piece is shaped as desired.

Thus the inlay 40 shown in FIGS. 5A and 5B can be manufactured.

Here, the softening temperature of the base materials 41 and 42 is approximately 100° C. to 150° C. for PET-G, and approximately 80° C. to 100° C. for PVC.

As described in the first embodiment, the substrate 2 of the antenna sheet 1 is made from PEN or PET. The softening temperature of PEN is approximately 269° C., and the softening temperature of PET is approximately 258° C. That is, in comparison with a thermoplastic material having a low softening point such as PET-G, which was used for substrates in conventional antenna sheets, the heat-resistance temperature of the substrate 2 can be increased.

Therefore, when the base materials 41 and 42 and the inlet 30 are heated to approximately 130° C. to 170° C., the base materials 41 and 42 soften, whereas the substrate 2 of the antenna sheet 1 does not. Thus, when the inlet 30 including the antenna sheet 1 and the base materials 41 and 42 are laminated and joined by thermal lamination, even if heat is applied to the substrate 2 of the antenna sheet 1, the substrate 2 can be prevented from plasticizing and flowing. Therefore, the antenna coil 4 can be prevented from moving in accordance with the flow of the substrate 2, and the reliability of data communication can be increased.

Even if the substrate 2 is heated in excess of its softening temperature such that it is plasticized by the heat and flows, since the antenna coil 4 is formed in a film shape as described above, in comparison with a conventional wire-wound antenna coil, there is a larger contact area of the antenna coil 4 with the substrate 2, whereby the flow resistance of the antenna coil 4 can be increased. Therefore, it is possible to prevent the antenna coil 4 from moving according to the flow of the substrate 2, and to improve the reliability of data communication.

<Second Embodiment>

Subsequently, a second embodiment of the present invention will be explained with reference to FIG. 1 to FIG. 5A, and using FIG. 6. An inlay 40B of this embodiment differs from the inlay 40 described in the first embodiment in that the outer surface 20*a* of the IC module 20 (outer surface of the sealing resin section 23) is formed roughly in the same place as the outer surface 42*a* of the base material 42. Since the configuration is otherwise similar to the first embodiment, like parts are denoted with like reference numerals, and are not repetitiously explained.

Figure 6:
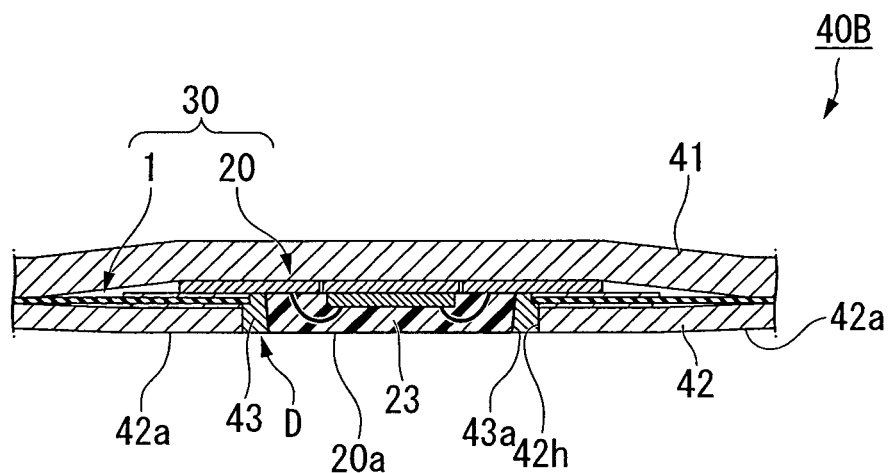
FIG. 6 is a partial cross-sectional view corresponding to FIG. 5B of an inlet according to a second embodiment of the present invention.

As shown in FIG. 6, in this embodiment, as in the first embodiment described above, the sealing material 43 is arranged between the inside face of the opening 42*h* and the sealing resin section 23, and the gap D is filled in using the sealing material 43. Furthermore, unlike the first embodiment, the outer surface of the sealing resin section 23, which is a part of the outer surface 20*a* of the IC module 20, is formed roughly in the same plane as the outer surface 42*a* of the base material 42. Therefore, in this embodiment, the outer surface of the inlay 40B, which includes the outer surface 42*a* of the base material 42, the outer surface 43*a* of the sealing material 43, and the outer surface of the sealing resin section 23 (the outer surface 20*a* of the IC module 20), is formed roughly flat and roughly in the same plane. The inlay 40B can be manufactured using the first manufacturing method described in the first embodiment.

According to the inlay 40B of this embodiment, as in the first embodiment, since the gap D is filled by the sealing material 43, external static electricity can be prevented from infiltrating the gap D and adversely affecting the IC module 20. Furthermore, since the gap D is filled with the sealing material 43, as in the first embodiment it is possible to prevent a catch from occurring at the gap D during a flatness test such as a ball pen test, whereby the flatness and smoothness of the inlay 40B can be increased.

<Third Embodiment>

Subsequently, a third embodiment of the present invention will be explained with reference to FIGS. 1A to 5A, and using FIG. 7. The inlay 40C of this embodiment differs from that of described in the first embodiment in that the antenna coil 4 and the connection part of the IC module 20 are covered by the sealing material 43. Since the configuration is otherwise similar to the first embodiment, like parts are denoted with like reference numerals, and are not repetitiously explained.

Figure 7:
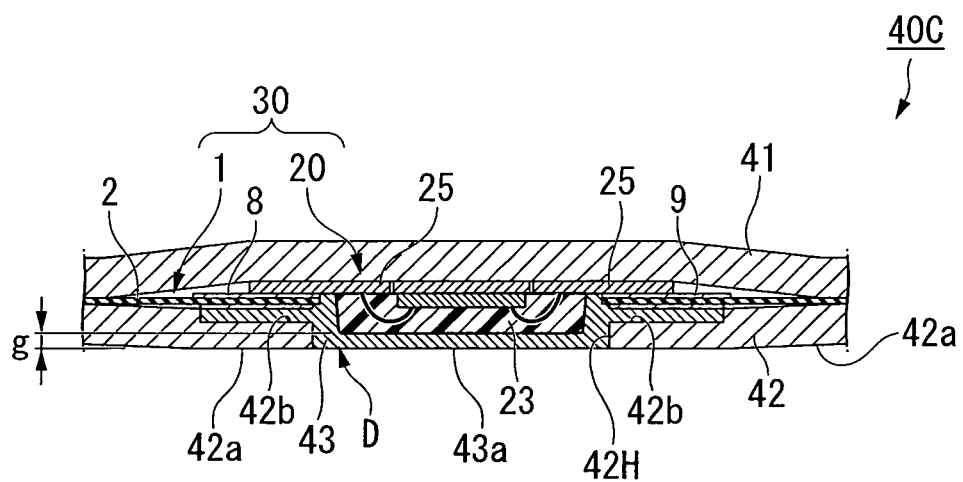
FIG. 7 is a partial cross-sectional view corresponding to FIG. 5B of an inlet according to a third embodiment of the present invention.

As shown in FIG. 7, in the inlay 40C of this embodiment, the connection section between the antenna connecting lands 8 and 9 of the antenna coil 4 (see FIG. 4A) and the antenna land 25 of the IC module 20 is covered with the sealing material 43, which is formed on the opposite side with the substrate 2 in between.

The opening 42H formed in the base material 42 is formed such thin the opening on the inlet 30 side is larger than the opening on the outer surface 42*a* side, and a recess 42*b* is formed on the inlet 30 side of the base material 42.

The inlay 40C can be manufactured by forming the opening 42H beforehand in the base material 42, and, in the second manufacturing method described in the first embodiment, using the sealing material 43 to cover the opposite side by pinching the antenna connecting lands 8 and 9 of the antenna coil 4 and the substrate of the connection section of the antenna land 25 of the IC module 20.

In this embodiment, since the sealing material 43 covers the connection section between the antenna coil 4 and the IC module 20, it can reinforce the connection section between the antenna connecting lands 8 and 9 and the antenna land 25, thereby increasing the mechanical strength and the reliability of the connection section.

As shown in FIG. 6, this embodiment can also be applied in a case where the outer surface 20*a* of the IC module 20 and the outer surface 42*a* of the base material 42 are roughly in the same plane.

(Electronic Passport)

Subsequently, an electronic passport 100 will be explained as one example of a data carrier with non-contact type IC and an inlay with cover.

Figure 8:
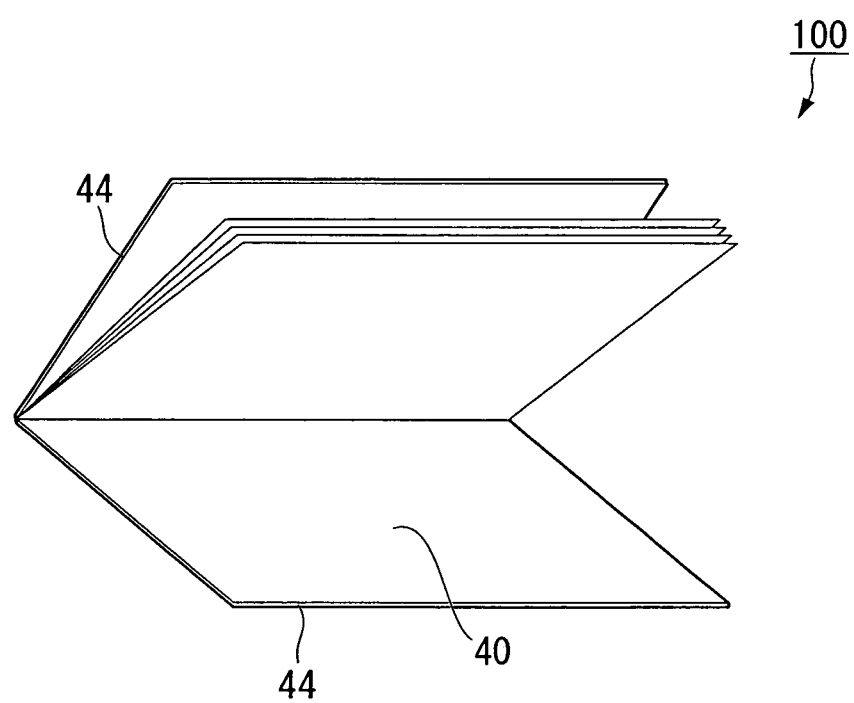
FIG. 8 is a perspective view of the schematic configuration of an electronic passport according to an embodiment of the present invention.

As shown in FIG. 8, an electronic passport 100 includes the inlay 40 described above as its front cover. A cover material 44 is joined to one face of the inlay 40 and becomes the front cover of the electronic passport 100.

When the cover material 44 is joined to the inlay 40 in this manner, the external appearance and texture of the electronic passport 100 including the inlay 40 can be made similar to a conventional passport. Also, since the inlay 40C prevents infiltration of static electricity, and has a outer surface with increased flatness, it becomes possible to provide the electronic passport 100 which has high reliability of data communication, enhanced ability to input characters and print a stamp, and a better external appearance.

The present invention is not limited to the embodiment described above. For example, the antenna coil can be a needle-shaped wire-wound coil such as that disclosed in Japanese Patent No. 3721520. In this case, a material similar to the one that pinches the inlet in the embodiment described above can be used as a substrate (first base material) for the antenna sheet 1, making it possible to omit one of the base materials bonded to the outside of the inlet. Therefore, in comparison with a case where a cover material is joined to the outer surface of the substrate of the antenna sheet, the inlay with cover can be made thinner.

When a cover material is used as the substrate (first base material) of the antenna sheet, and a similar base material having the opening described in the above embodiment is used as the second base material, the inlay with cover can be made even thinner and more flexible.

While in the embodiment described above, a pressing step is introduced when manufacturing the inlay, the pressing step need not be performed. Even when the pressing step is not performed, the gap between the IC module and the inside face of the opening of the base material can be filled in using the sealing material. Instead of performing a pressing step, the outer surface of the base material and the outer surface of the sealing material can be flattened using, for example, a roller, a scraper, etc.

The shape of the antenna coil need not be rectangular. Furthermore, the number of winds of the antenna coil 4 is also not limited to the embodiment described above. With regard to the material quality of the antenna circuit, it can be made from a material other than aluminum, such as, for example, gold, silver, or copper.

While the above embodiment describes an electronic passport as an example of a data carrier with non-contact type IC including an inlay, the inlay of the present invention can also be used in, for example, electronic identification documents and various types of electronically confirmable activity history documents.

EXAMPLE 1

A polyolefin synthetic sheet with a thickness of 178 µm was used as the base material 41, a polyolefin synthetic sheet with a thickness of 178 µm, and including an opening in a portion where the IC module will be arranged, was used as the base material 42, and an antenna sheet including an IC module and an antenna circuit was used.

As the sealing material, a resin tape with a thickness of 50 µm and including a sticky material and a tape support of polyester resin was used. In the sealing material used here, the longitudinal elastic modulus of the polyester resin of the tape support is less than the longitudinal elastic modulus of the sealing resin section of the IC module.

The base materials 41 and 42 were coated with an aqueous emulsion adhesive (EAA), and the sealing material including the resin tape was arranged on the IC module of the antenna sheet. The base material 41, the antenna sheet, and the base material 42 were bonded in that order and pressurized, such that the IC module was aligned with the opening of the base material 42, thereby obtaining a sample for Example 1.

Six of these were made, obtaining samples 1-1, 1-2, 1-3, 1-4, 1-5, and 1-6.

When the sections of the obtained inlays were measured with an electron microscope, in each sample there was no gap between the inside face of the opening of the substrate and the sealing resin section of the IC module. The step between the outer surface of the sealing material covering the IC module and the outer surface of the base material including the opening was as follows:

Sample 1-1: 4 µm

Sample 1-2: 11 µm

Sample 1-3: 10 µm

Sample 1-4: 15 µm

Sample 1-5: 9 µm

Sample 1-6: 9 µm (Static Electricity Test)

A static electricity test was carried out in accordance with ISO10373-7 and JIS X6305-7.

Firstly, an inlay such as that shown in FIG. 5A was overturned and disposed on the base material including the opening. With the long side direction of the rectangular inlay as the left-right direction and the short side direction as the up-down direction, the inlay was arranged such thin the opening was at the top-right corner of the rectangle when viewed from above. Voltages of +6 kV, −6 kV, +8 kV, and −8 kV were applied in that order from the outer surface of the substrate where the opening was formed. Every time a different voltage value was applied, the basic operation of the IC chip was checked and the communication response of the inlay was measured.

Each voltage was applied at a total of twenty-five positions, which were sequentially measured: dividing the vertical direction of the horizontal rectangular region having the antenna coil as its outer periphery into quarters, and dividing the horizontal direction into fifths, vertical×horizontal is 4×5=20 (20 positions), the center of the sealing resin section of the IC module (position center), on the substrate on the left side of the opening (position left), on the substrate on the right side of the opening (position right), on the substrate on the upper side of the opening (position up), and on the substrate on the lower side of the opening (position under).

Table 1 shows measurements obtained in the static electricity test. In Table 1, symbol 'P' indicates that the communication response was excellent for two seconds or longer, and 'F' indicates that the communication response was poor. Also, '20' represents position 20, 'M' represents position center, represents position left, 'R' represents position right, 'Up' represents position up, and 'Un' represents position under.

The apparatus used for communication response was a PR-450 UDM non-contact reader/writer manufactured by DENSO WAVE, the communication response being checked at a distance of 10 mm.

TABLE 1

| | | +6 kV | | | | | | -6 kV | | | | | | +8 kV | | | | | | -8 kV | | | | | |
|---|---|---|---|---|---|---|---|---|---|---|---|---|---|---|---|---|---|---|---|---|---|---|---|---|---|
| | | 20 | M | L | R | Up | Un | 20 | M | L | R | Up | Un | 20 | M | L | R | Up | Un | 20 | M | L | R | Up | Un |
| Example 1 | 1-1 | P | P | P | P | P | P | P | P | P | P | P | P | P | P | P | P | P | P | P | P | P | P | P | P |
| | 1-2 | P | P | P | P | P | P | P | P | P | P | P | P | P | P | P | P | P | P | P | P | P | P | P | P |
| | 1-3 | P | P | P | P | P | P | P | P | P | P | P | P | P | P | P | P | P | P | P | P | P | P | P | P |
| | 1-4 | P | P | P | P | P | P | P | P | P | P | P | P | P | P | P | P | P | P | P | P | P | P | P | P |
| | 1-5 | P | P | P | P | P | P | P | P | P | P | P | P | P | P | P | P | P | P | P | P | P | P | P | P |
| | 1-6 | P | P | P | P | P | P | P | P | P | P | P | P | P | P | P | P | P | P | P | P | P | P | P | P |
| Comparative Example 1 | A-1 | P | P | P | P | P | F | | | | | | | | | | | | | | | | | | |
| | A-2 | P | P | P | P | P | P | P | P | F | | | | | | | | | | | | | | | |
| | A-3 | P | P | P | P | P | P | P | P | P | P | P | P | P | P | P | F | | | | | | | | |
| | A-4 | P | P | P | P | P | P | P | P | P | P | P | P | P | P | P | P | P | F | | | | | | |
| | A-5 | P | P | P | P | P | P | P | P | P | P | P | P | P | P | P | F | | | | | | | | |
| | A-6 | P | P | P | P | P | P | P | P | P | P | P | P | P | P | P | P | P | F | | | | | | |

As shown in Table 1, in this embodiment, excellent communication responses were obtained at all applied voltages and at all positions in each of the samples 1-1 to 1-6.

(Ball Pen Test)

On the outer surface of the base material 42, a ball pen was made to travel along the long side direction of the antenna coil such as to pass over the IC module.

The ball pen used was a commercially available ball pen with a ball diameter of 1 mm and a weight of 600 g, and it was made to travel at a speed of 25 mm/sec. After the ball pen had traveled back and forth 25 times, the basic operation of the IC chip was checked and the communication response of the inlay was measured.

Table 2 shows measurement results of the ball pen test. In Table 2, 'OK' indicates an excellent communication response, and 'NG' indicates a poor communication response.

The apparatus used for communication response was a PR-450 UDM non-contact reader/writer manufactured by DENSO WAVE, the communication response being checked at a distance of 10 mm.

TABLE 2

| | | |
|---|---|---|
| Example 1 | 1-1 | OK |
| | 1-2 | OK |
| | 1-3 | OK |
| | 1-4 | OK |
| | 1-5 | OK |
| | 1-6 | OK |
| Comparative Example 1 | A-1 | NG |
| | A-2 | NG |
| | A-3 | OK |
| | A-4 | OK |
| | A-5 | NG |
| | A-6 | NG |

As shown in Table 2, in this embodiment, all the samples 1-1 to 1-6 obtained excellent communication responses.

(Stamp Test)

A stamp was used to apply a weight to the outer surface of the substrate which the opening is formed in.

The stamp used had a punch tip diameter of 10 mm. After the stamp had made 50 hits with a weight of 250 g at a fall height of 320 mm, the basic operation of the IC chip was checked and the communication response of the inlay was measured.

Table 3 shows measurement results of the stamp test. In Table 3, 'OK' indicates an excellent communication response, and 'NG' indicates a poor communication response.

The apparatus used for communication response was a PR-450 UDM non-contact reader/writer manufactured by DENSO WAVE, the communication response being checked at a distance of 10 mm.

TABLE 3

| | | |
|---|---|---|
| Example 1 | 1-1 | OK |
| | 1-2 | OK |
| | 1-3 | OK |
| | 1-4 | OK |
| | 1-5 | OK |
| | 1-6 | OK |
| Comparative Example 1 | A-1 | NG |
| | A-2 | NG |
| | A-3 | NG |
| | A-4 | NG |
| | A-5 | NG |
| | A-6 | NG |

As shown in Table 3, in this embodiment, all the samples 1-1 to 1-6 obtained excellent communication responses.

COMPARATIVE EXAMPLE 1

Samples were made by the same method as in Example 1, except that the sealing material was not used.

Six samples A-1, A-2, A-3, A-4, A-5, and A-6 were obtained.

When the sections of the obtained inlays were measured with an electron microscope, in each sample, a gap of approximately 50 μm was generated between the inside face of the opening of the substrate and the sealing resin section of the IC module. The step between the outer surface of the sealing material covering the IC module and the outer surface of the base material including the opening was as follows:

Sample A-1: 26 μm
Sample A-2: 21 μm
Sample A-3: 22 μm
Sample A-4: 27 μm
Sample A-5: 26 μm
Sample A-6: 25 μm When the static electricity test described above was carried out, as shown in Table 1, in sample A-1, there was a poor communication response when +6 kV was applied at position under (Un). In sample A-2, there was a poor communication response when −6 kV was applied at position left (L). In sample A-3, there was a poor communication response when +8 kV was applied at position right (R). In sample A-4, there was a poor communication response when +8 kV was applied at position under (Un). In sample A-5, there was a poor communication response when +8 kV was applied at position right (R). In sample A-6, there was a poor communication response when +8 kV was applied at position under (Un).

When the ball pen test was carried out, as shown in Table 2, while there were poor communication responses in sample A-1, sample A-2, sample A-5, and sample A-6, excellent communication responses were obtained in sample A-3 and sample A-4.

When the stamp test was carried out, as shown in Table 3, all the samples from A-1 to A6 obtained poor communication responses.

As indicated by these results, according to the embodiment using the sealing material, static electricity can be prevented from infiltrating through the gap, and a defect rate of roughly 0% can be achieved in the static electricity test. Whereas, in Comparative Example 1, which does not use a sealing material, the test results indicate that the probability of a poor communication response is extremely high.

<Fourth Embodiment>

A non-contact type information medium (hereinafter abbreviated as 'information medium') according to a fourth embodiment of the present invention will be explained based on the drawings.

Figure 9:
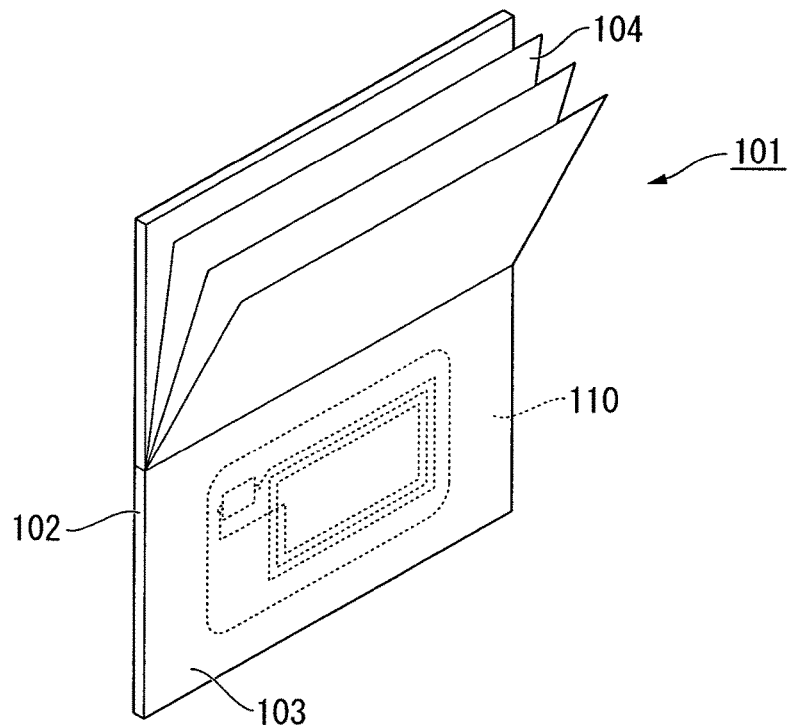
FIG. 9 is a diagram of a booklet with a non-contact type information medium attached thereto according to a fourth embodiment of the present invention.

FIG. 9 is a perspective view of a booklet 101 including an information medium 110 of this embodiment. The information medium 110 is affixed while being pinched between one of two cover members 102, which constitute a front cover and a rear cover of the booklet 101, and an inner bonding sheet 103 that is bonded to that cover member 102. A plurality of text sheets 104 are bound between the front cover and the rear cover, enabling the booklet 101 to be used for various purposes such as a savings passbook.

Incidentally, the information medium 110 can be attached to face of one of the cover members 102 of the booklet 101. In this case, the information medium 110 is preferably attached to the inner face of the cover member 102 (the face where the cover members 102 touches the text sheets 104), rather than to its outer face. This configuration can protect the information medium 110 from external collisions against the booklet 101.

Alternatively, the information medium 110 can be attached to one of the pages of the text sheets 104 of the booklet 101. For example, a predetermined page of the text sheets 104 is given a larger area than the other pages, and folded such that its area becomes the same as the other pages, enabling the information medium 110 to be stored in a space formed by the folded section. The folded section is sealed by a method such as gluing or stitching.

Figure 10:
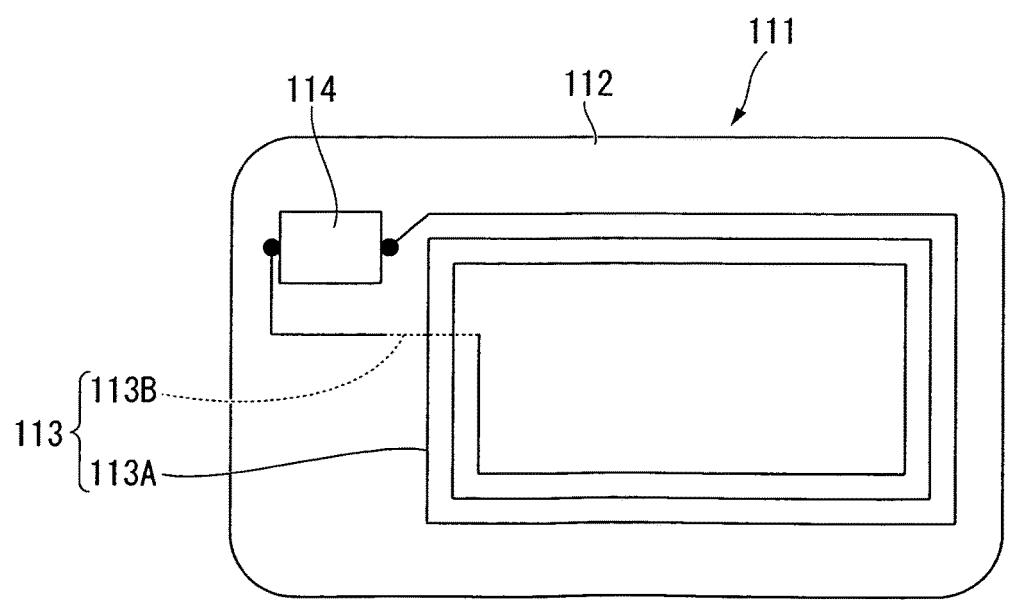
FIG. 10 is a diagram of a mold of an IC inlet of the same non-contact type information medium.

FIG. 10 is a view showing a mold of an IC inlet 111 that constitutes a part of the information medium 110. The IC inlet 111 includes an insulating sheet 112, an antenna coil 113 formed on both sides of the sheet 112, and an IC chip 114 attached to the sheet 112.

Various types of resin such as polyethylene terephthalate (PET) can suitably be used as the material for the sheet 112. The antenna coil 113 is formed by a method such as etching, wire bonding, or printing, using a conductor such as aluminum or silver. Of these, aluminum is inexpensive, making it preferable when considering the manufacturing cost. The antenna coil 113 includes an antenna loop 113A provided on one face of the antenna coil 113, and a jumper line 113B provided on another face. The end of the jumper line 113B is electrically connected to the antenna loop 113A via a through hole (not shown) provided in the sheet, or by a method such as crimping.

The IC chip 114 is electrically connected to the antenna coil 113 by welding or the like, and attached to the sheet 112. This enables the IC inlet 111 to transmit and receive data to/from an external data reading device and such like in a non-contact manner.

Figure 11:
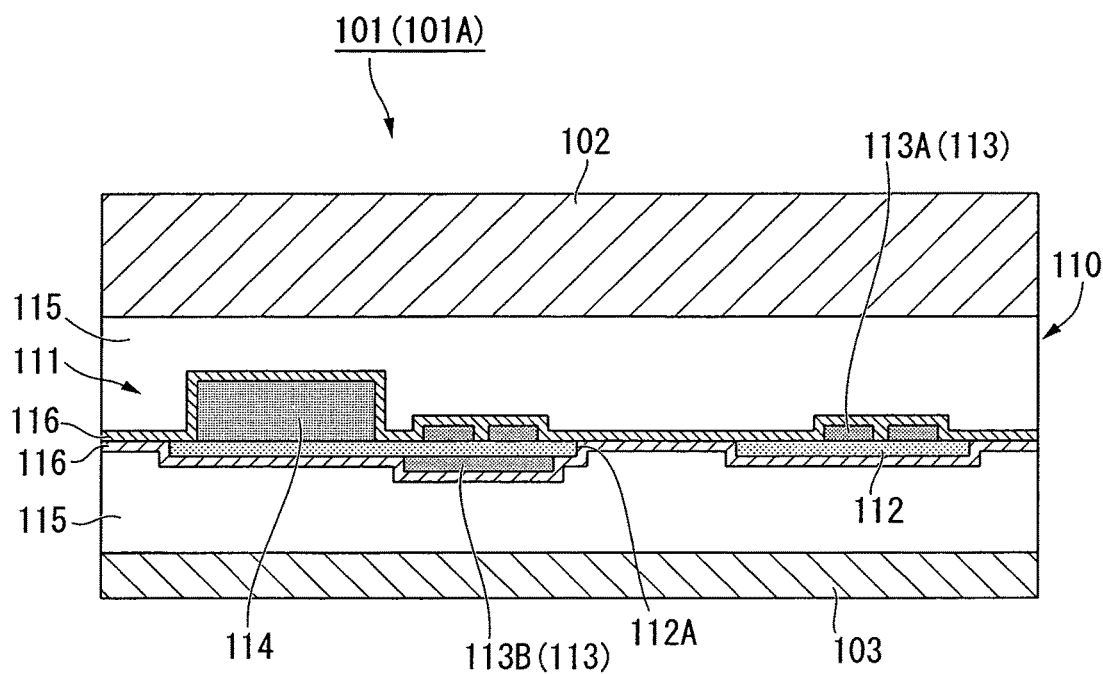
FIG. 11 is a cross-sectional view of the same non-contact type information medium attached to the same booklet 101.

FIG. 11 is a cross-sectional view of an information medium 110 attached to a booklet 101. The information medium 110 is formed by using two sheet-like porous base materials 115 to pinch an IC inlet 111 from above and below. The IC inlet 111 and the porous base materials 115 are joined in a single piece by an adhesive 116.

In consideration of a manufacturing step of the information medium 110 described below, the porous base materials 115 should preferably have thermoplasticity. Specifically, a base material can be obtained using a resin such as polyethylene, polypropylene, polyvinyl chloride, polyvinylidene chloride, polystyrene, polyvinyl acetate, polyester, or a combination of such resins, which is then subjected to a process such as mixing with porous particles such as silica, foaming by the addition of air during kneading, and stretching followed by punching. Since this type of base material is commercially available as resin sheet and synthetic paper in which print suitability is given to an inkjet, an offset, and the like, these can be used.

Similarly, the adhesive 116 is preferably hot-melting. Specifically, adhesives made from various types of thermoplastic resin, such as an ethylene-vinyl acetate copolymer (EVA)-based, ethylene-acrylic acid copolymer (EAA)-based, ethylene methyl acrylic acid copolymer (EMAA)-based, polyester-based, polyamide-based, polyurethane-based, and olefin-based, can suitably be used.

A substance that is resistant to chloride ions is mixed into the adhesive 116, and prevents the permeation of chloride ions. That is, the layer that includes the adhesive 116 also functions as a chloride ion-resistant layer, which covers the antenna coil 113 formed on the IC inlet 111 and prevents the chloride ions from contacting the antenna coil 113, thereby preventing deterioration such as corrosion. Such an adhesive 116 can easily be obtained by adding an epoxy-based cross-linking agent to an EAA-based aqueous emulsion adhesive, or by using a gravure coater to apply an acrylic emulsion adhesive and the like according to a predetermined coating thickness, etc.

If an antenna formed by etching an aluminum thin film is used, it is preferable to use a chloride ion-resistant layer, because aluminum is especially weak to chloride ions.

To form a chloride ion-resistant layer using the adhesive 116, in addition to the material quality, consideration must also be given to the thickness of the layer formed by the adhesive 116. Tests were carried out to clarify the relationship between these.

Methods used in the tests will be explained.

(Test Samples)

Using a 'TESLIN Sheet' (a product manufactured by PPG Industry; thickness=380 µm) as porous base materials, an IC inlet having an aluminum antenna coil was pinched and affixed onto a sheet made from PET.

As the adhesive, three types of conventional adhesives were used: an EMAA-based adhesive, an EMAA-based adhesive containing an epoxy-based cross-linking agent, and an acrylic-based adhesive 116; the coating thicknesses and additive quantities were varied. These samples were used in a salt water spray test described below.

Samples were also created in which each of the adhesives complying with these conditions was applied directly to the IC inlet without pinching it between porous base materials, and these samples were used in a hydrochloride test described below.

(Test 1: Salt Water Spray Test)

A salt water spray test was conducted in compliance with ISO10373-1, and the results were evaluated in the following three stages.

A: No corrosion whatsoever, B: Partial corrosion, C: Total corrosion and defective performance.

(Test 2: Hydrochloride Test)

A uniquely set testing method, performed according to the following procedures.

(1) One drop of 2N hydrochloride (HCl) was dropped onto each sample, obtained by applying each type of adhesive directly to an IC inlet, which was then covered from above with a film of PET so that it did not dry.

(2) Each sample was then put into an 80° C. oven, and the time taken for the aluminum to melt was measured.

Table 4 shows results obtained for each sample in Test 1 and Test 2.

TABLE 4

| Adhesive | Coating Thickness | Test 1 | Test 2 |
| --- | --- | --- | --- |
| EMAA-based thermoplastic adhesive | 4 μm | C | 1 minute |
| EMAA-based thermoplastic adhesive | 8 μm | C | 2 minute |
| EMAA-based thermoplastic adhesive | 12 μm | B | 4 minute |
| EMAA-based thermoplastic adhesive + epoxy-based cross-linking agent 1% | 4 μm | B | 3 minute |
| EMAA-based thermoplastic adhesive + epoxy-based cross-linking agent 5% | 4 μm | A | 10 minute |
| Acrylic-based thermoplastic adhesive | 4 μm | B | 3 minute |
| Acrylic-based thermoplastic adhesive | 8 μm | A | 8 minute |

As shown in Table 4, the results of Test 1 and Test 2 indicated a consistently good correlation. The samples that were joined using only an EMAA-based thermoplastic adhesive in the conventional manner could not obtain sufficient durability against the salt water spray, even when the thickness of the adhesive coating was increased.

In contrast, when an epoxy-based cross-linking agent is added to the EMAA-based thermoplastic adhesive, the adhesive becomes resistant to chloride ions. Durability was enhanced by increasing the mixture ratio of the epoxy-based cross-linking agent.

Furthermore, the acrylic-based adhesives had greater durability against salt water spray than the EMAA-based adhesives, and were resistant to chloride ions. Their chloride ion resistance was increased by making the coating thicker.

The above results indicate that, by adjusting the mixture ratio of a substance that is resistant to chloride ions, or by selecting an adhesive made from a material that is resistant to chloride ions and adjusting its coating thickness, it is possible to form a chloride ion-resistant layer having a desired resistance to chloride ions.

A method of manufacturing the information medium 110 configured as described above will be explained.

Firstly, an antenna coil 113 is made by providing an antenna loop 113A and a jumper line 113B on a sheet 112. An IC chip 114 is connected the antenna coil 113 to form an IC inlet 111. Up to this point, the method is similar to a conventional method for manufacturing an IC inlet.

Figure 12:
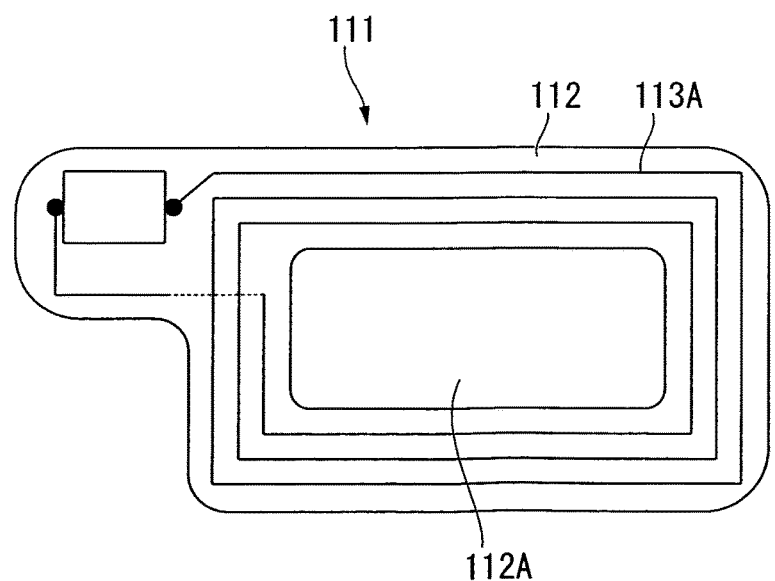
FIG. 12 is a diagram of a cut state of the same IC inlet when manufacturing the same non-contact type information medium.

As shown in FIG. 12, to achieve a good joint between the IC inlet 111 and porous base materials 115, the periphery of the sheet 112 is cut away; in addition, a region of the sheet 112 that is inside the antenna loop 113A is removed, forming a through hole 112A which penetrates in the thickness direction of the sheet 112.

The through hole 112A can be suitably formed using a punching mold.

Therefore, even in cases such as when IC inlets are mass-produced by forming a great many antenna coils on a single large sheet, punching enables a great many through holes to be easily made.

With regard to achieving a good joint with the porous base materials, the size of the through hole 112A is preferably set such that the area of a cross-section orthogonally intersecting the thickness direction of the through hole 112A occupies 60% or more of the region enclosed within the innermost antenna of the antenna loop 113A. With regard to the same point, the area of the sheet 112 is preferably set at not less than 3% and less than 20% of the area of the porous base material 115 it is joined to.

One face of each of the two porous base materials 115 formed with a desired size is coated with an adhesive 116 which has been made resistant to chloride ions in the manner described above. The faces coated with the adhesive 116 are arranged opposite the IC inlet 111, which is then pinched and pressed by the porous base materials 115 from above and below. In this manner, a chloride ion-resistant layer including the adhesive 116 is formed such as to cover the antenna coil 113.

When the porous base materials 115 are made from thermoplastic resin, if heat is applied at the same time as applying pressure, the porous base materials 115 soften and deform, whereby projections and recesses on the surface of the IC inlet 111 due to the IC chip 114 and the like are absorbed by the porous base materials 115. As a result, an information medium 110 having flat top and bottom faces can be obtained.

A conventional method of manufacturing an IC card and the like can be used in the above process, which can be executed using, for example, a hot press.

As shown in FIG. 11, the information medium 110 thus obtained is pinched between the front cover member 102 and the inner bonding sheet 103, and, when these are all joined in a single piece using an adhesive (not shown), the booklet 101 including the information medium 110 can be obtained.

The porous base materials 115 that constitute the outer faces of the information medium 110 have good close attachment to various types of adhesive, and can therefore be excellently joined without problems, even when using a water-based emulsion adhesive and the like used in conventional booklet joining. Furthermore, since the outer faces of the information medium 110 are flatly formed without projections and recesses, the information medium 110 can be attached without spoiling the external appearance of the booklet 101.

When joining the cover members 102 to the information medium 110, it is preferable to use a reaction curing type adhesive with no volume change. When a dry curing type adhesive with volume change is used, if a part of the information medium includes projections and recesses, the quantity of adhesive used will increase in the recesses. As a result, there is greater volume reduction when drying, and there are cases where the external appearance is spoiled due to a partial collapse of cover members 102 and the like which overlap the recesses.

As the adhesive with no volume change, it is possible to use, for example, a two-part mixed type epoxy-based adhesive, a moisture curing type silicon-based adhesive, a one-part curing type urethane-based adhesive, and the like. Various types of hot-melt adhesive can also be used, such as EVA-based, EAA-based, polyester-based, polyamide-based, polyurethane-based, and olefin-based. Of these adhesives, from the viewpoints of workability and durability, a reactive type hot-melt adhesive is more preferable.

Using example, the information medium 110 and the booklet 101 of this embodiment will be further explained.

(Example)

1. Creating an IC Inlet

A PET sheet having a thickness of 38 micrometers (μm) was used as the sheet 112. Aluminum deposition and printing of a mask layer having the same shape as the antenna coil 113 were performed on both faces of the sheet 112, and pattern etching was used to form an antenna loop 113A on one face and a jumper line 113B on the other face. In addition, the antenna loop 113A and the jumper line 113B were joined by caulking, and an IC chip 114 was welded to the connection terminal section of the antenna coil 113.

Figure 13:
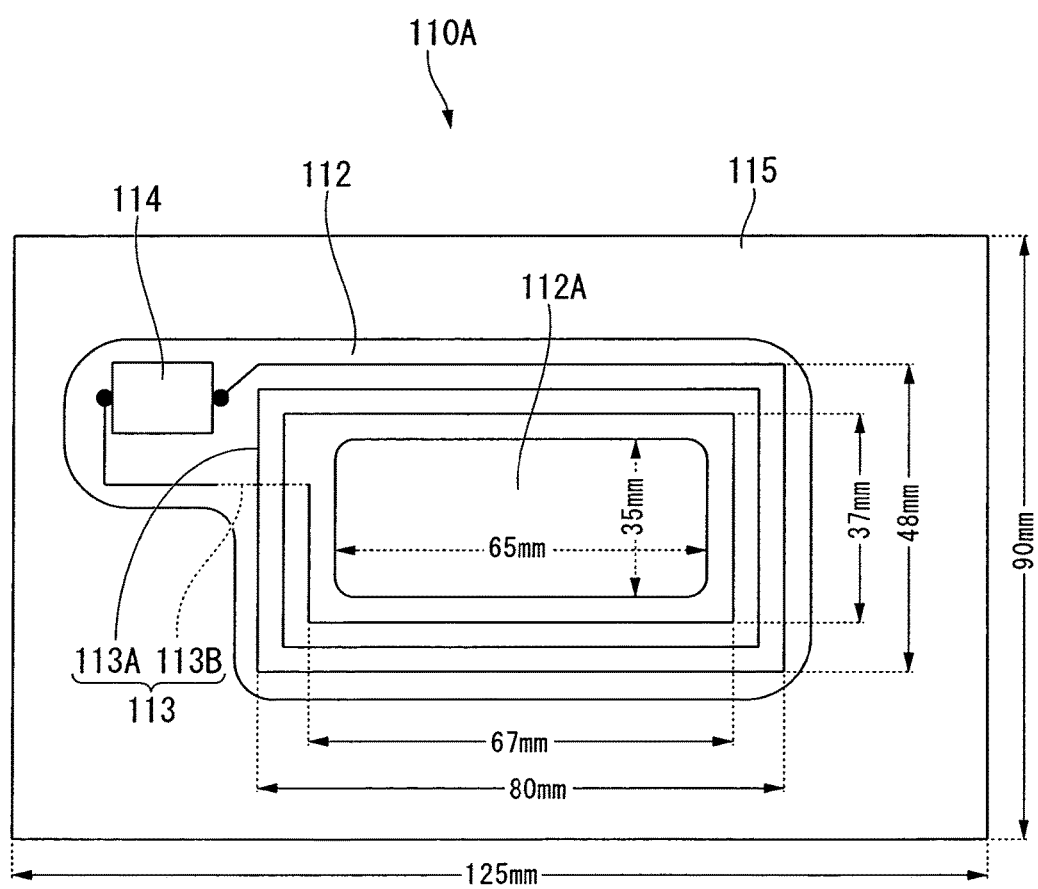
FIG. 13 is a diagram showing dimensions of each part of the same non-contact type information medium in an example.

FIG. 13 shows dimensions of each section of an information medium 110A in this example. The outer periphery of the roughly square antenna loop 113A is 80 millimeters (mm)×48 mm, and its inner periphery is 67 mm×37 mm.

Subsequently, a part of the sheet 112 that is inside the antenna loop 113A was punched away to form a through hole 112A having a roughly square shape of 65 mm×35 mm. Moreover, leaving an outline that is 2 mm from the outer periphery of the antenna loop 113A and the IC chip 114, the sheet 112 that was further to the outside than that was removed by punching. The cross-sectional area orthogonal to the thickness direction of the through hole 112A thereby becomes approximately 91% of the region inside the periphery of the antenna loop 113A. In this manner the IC inlet 111 was produced.

2. Preparing the Porous Base Materials

A Teslin sheet (a product manufactured by PPG Industries; thickness: 380 μm) was used as the material for the porous base materials 115. An adhesive, obtained by mixing 1 part by weight of a soluble epoxy curing agent with 20 parts by weight of an EMAA-based aqueous emulsion adhesive (AC-3100, a product manufactured by Chuo Rika Kogyo Corporation), was applied to one face of each sheet at an amount of 5 g/m² (coating thickness: approximately 5 μm). After drying, two sheets of 150 mm×200 mm were cut, obtaining porous base materials 115. At this point in time, the area of the IC inlet 111 was 15% of the area of the porous base materials 115.

A hole corresponding in size to the lead frame of the IC chip 114 was then drilled into one of the porous base materials 115, and a hole corresponding in size to the mold of the IC chip 114 was drilled into the other porous base material 115.

3. Manufacturing the Information Medium

The IC inlet 111 and the porous base materials 115 were arranged such that the read frame and mold of the IC chip 114 were stored in the holes formed in the respective porous base materials 115. The IC inlet 111 was then laminated by pinching it from above and below by the porous base materials 115, and temporarily held by spot heating.

The porous base materials 115 and the IC inlet 111 that were temporarily held by spot heating were pinched between two stainless steel plates and subjected to heating and pressurizing to join them completely together, thereby obtaining the information medium 110A. The heating and pressurizing conditions were adjusted as appropriate between a heater unit temperature of 100° C. to 160° C., pressure of 5 KgF/cm² to 30 KgF/cm², and a processing time of 15 seconds to 120 seconds.

4. Attachment to the Booklet

A cloth for book cover (Enviromate H, a product manufactured by ICG Holliston) was used as the material for the cover members 102. This was cut to the same size as the information medium 110A to obtain the cover members 102.

A moisture curing hot-melt adhesive (Esdain 9635, a product manufactured by Sekisui Fuller Corp.) was melted with a heat roll coater, and an amount of 20 g/m² was applied to the cover members. The outer faces of the porous base materials 115 of the information medium 110A were affixed to the cover members 102 coated with the hot-melt adhesive, pressurized with rollers, and thereafter subjected to an aging process.

Subsequently, a plurality of text sheets 104 and one inner bonding sheet 103 are collated, and their centers are stitched using a sewing machine, thereby manufacturing a text section with the inner bonding sheet 103 attached to an outermost section. A water-based emulsion adhesive (SP-2850, a product manufactured by Konishi Corp.) was then applied at an amount of 20 g/m² to the porous base materials 115 on the opposite side of the information medium 110A to the side affixed to the cover members 102, and the porous base materials 115 were affixed to the inner bonding sheet 103. The book thus obtained is opened and cut to 125 mm×180 mm, obtaining a booklet 101. That is, the dimensions of the porous base materials 115 shown in FIG. 13 are the dimensions when the booklet 101A is folded.

(Comparative Example)

In a comparative example, although the IC inlet 111 was made using the same method as in the example, the size of the through hole 112A was 40 mm×30 mm. The cross-sectional area orthogonal to the thickness direction of the through hole 112A was approximately 48% of the region inside the periphery of the antenna loop 113A.

Moreover, the IC inlet 111 was attached to a booklet using the same procedure as the example, to obtain a booklet having roughly the same external appearance.

The front and rear covers of the booklet 101A of the example manufactured in the manner described above are formed smoothly, no projections or recesses being generated by the attachment of the information medium 110A. Furthermore, in various durability evaluation experiments, including storing it in a high temperature and high moisture environment and subjecting it to a bend test, the IC inlet 111 suffered no deterioration, especially of the antenna coil 113, and thus achieved excellent results.

When attempting to remove only the IC inlet from the booklet of the comparative example, in the booklet of the comparative example, it was possible to separate the IC inlet from the porous base materials and remove it without breaking the antenna coil. On the other hand, in the booklet 101A of the example, when attempting to peeling away the porous base materials 115, since the porous base materials 115 are directly and firmly joined together at the through hole 112A with a large area and around the IC inlet 111, a part of the antenna coil 113 and the porous base materials 115 was broken, and the IC inlet 111 could not be removed in a usable state.

According to the information medium 110 of this embodiment, when the IC inlet 111 is pinched between the porous base materials 115, which have been coated with the chloride ion-resistant adhesive 116, and joined to them in a single piece, a chloride ion-resistant layer is formed such as to cover the antenna coil 113 including the antenna loop 113A and the jumper line 113B. Therefore, even when the information medium 110 is attached to a booklet, chloride ions that permeate the cover members 102 and the inner bonding sheet 103 are prevented from reaching the antenna coil 113 and acting upon it, whereby deterioration of the antenna coil 113 is excellently prevented. Therefore, even when the information medium is applied in a booklet, a configuration can be accomplished where the information medium functions with high reliability for a long time period.

Furthermore, since the IC inlet 111 is pinched from above and below by the porous base materials 115, projections and recesses due to the IC chip 114 and the like are absorbed by the porous base materials 115, whereby the information medium can be configured with smooth top and bottom faces. As a result, even when the information medium 110 is applied in a booklet, the external appearance is not spoiled.

Moreover, since the through hole 112A is provided in the sheet 112 of the IC inlet 111, at the point of the through hole 112A, the porous base materials 115 are firmly affixed by the adhesive 116 without the sheet 112 in between them. Therefore, the entire information medium 110 can be stably joined. In addition, it is difficult to remove only the IC inlet for purposes of counterfeiting and such like, whereby security can be increased.

<Fifth Embodiment>

Subsequently, a fifth embodiment of the present invention will be explained.

Figure 15:
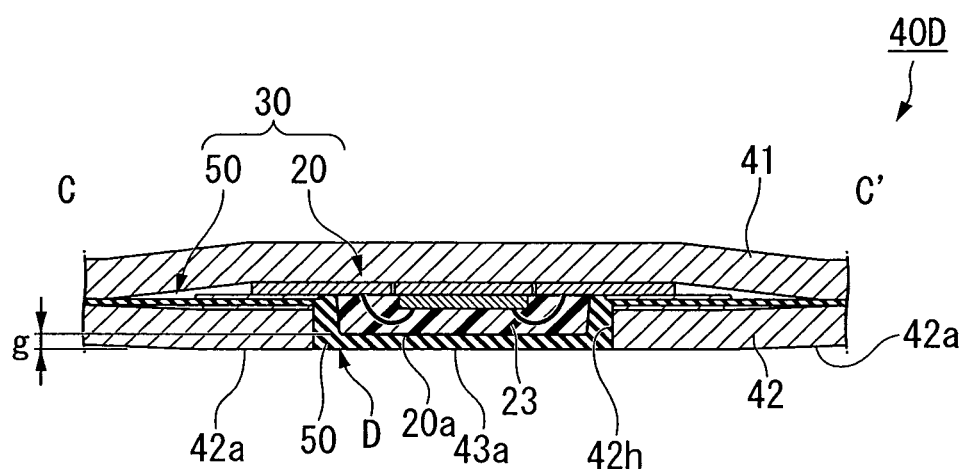
FIG. 15 is a partial cross-sectional view along the line C-C' (FIG. 5A) of an inlay 40D according to a modification of the first embodiment of the present invention.

FIG. 15 is a partial cross-sectional view along the line C-C' (FIG. 5A) of an inlay 40D according to the fifth embodiment of the present invention. Parts of the inlay 40D that are similar to the configuration of the inlay 40 according to the first embodiment (FIG. 5B) are designated by like reference numerals and are not repetitiously explained.

In FIG. 5B, the sealing material 43 having electrical insulation was provided between the IC module 20 and the inside face of the opening 42h. In contrast, a sealing material 50 in FIG. 15 is made by molding the antenna sheet 1 and the sealing material 43 into a single piece using a substance having electrical insulation. The same substance as that used for the sealing material 43 described above can be used for the sealing material 50.

With a configuration such as that shown in FIG. 15, since there is not gap between the antenna sheet 1 and the sealing material 43 as in the aspect of FIG. 5B, static electricity can be more reliably prevented from infiltrating the IC module 20, and the reliability of the operation of the IC module 20 can be increased.

Incidentally, in the second embodiment (FIG. 6) and the third embodiment (FIG. 7), the antenna sheet 1 and the sealing material 43 can be molded into a single piece using a substance having electrical insulation in the same manner as described in FIG. 15.

<Sixth Embodiment>

Subsequently, a sixth embodiment of the present invention will be explained.

Figure 16:
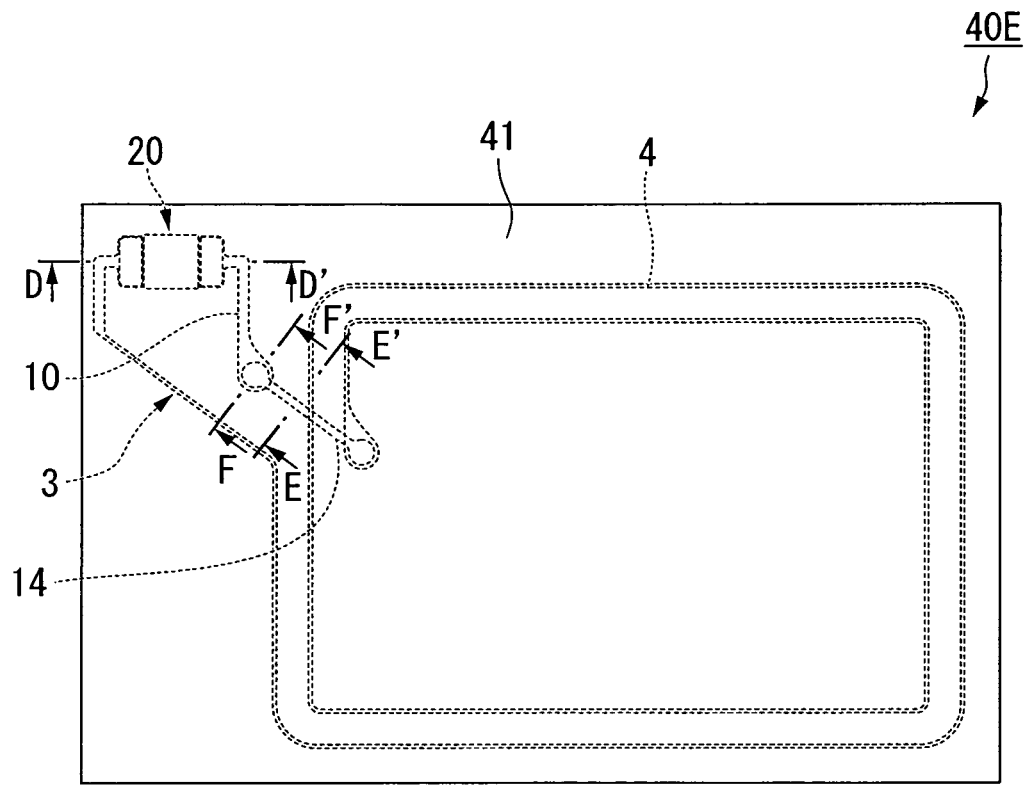
FIG. 16 is a plan view of an inlay 40E according to a sixth embodiment of the present invention.

FIG. 16 is a plan view of an inlay 40E according to a sixth embodiment of the present invention. The plan view shown in FIG. 16 is the same as the plan view of the inlay 40 according to the first embodiment (FIG. 5A). Parts of the configuration which are the same are therefore designated by like reference numerals, and are not repetitiously explained.

Figure 17:
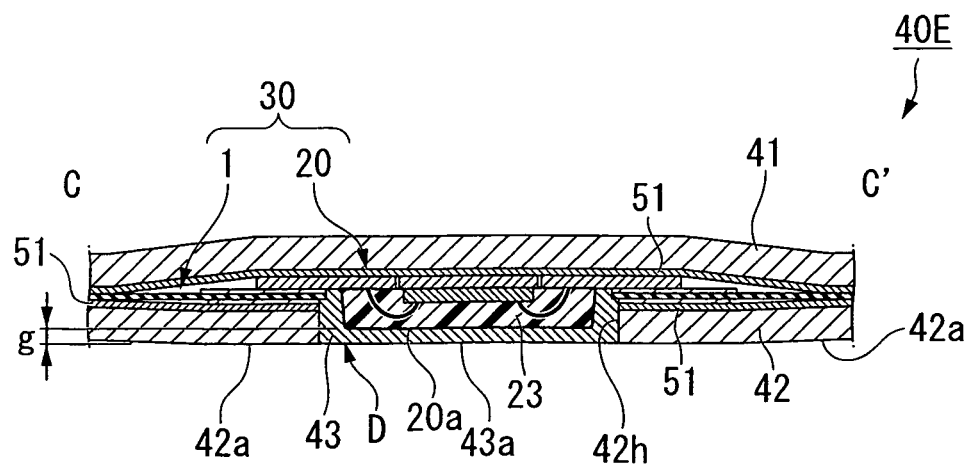
FIG. 17 is a partial cross-sectional view along the line D-D' (FIG. 16) of an inlay 40E according to the sixth embodiment of the present invention.

FIG. 17 is a partial cross-sectional view along the line D-D' (FIG. 16) of an inlay 40E according to a sixth embodiment of the present invention. In FIG. 17, parts of the configuration which are the same as the cross-sectional view of the inlay according to the first embodiment (FIG. 5B) are designated by like reference numerals, and are not repetitiously explained.

In the inlay 40E of FIG. 17, the inlet 30 is pinched between the base material 41 and the base material 42 as in FIG. 5B. However, in FIG. 17, faces of the base materials 41 and 42 which contact the antenna sheet 1 are coated with an adhesive 51. A chloride ion-resistant substance that suppresses the permeation of chloride ions is mixed into the adhesive 51.

Figure 18:
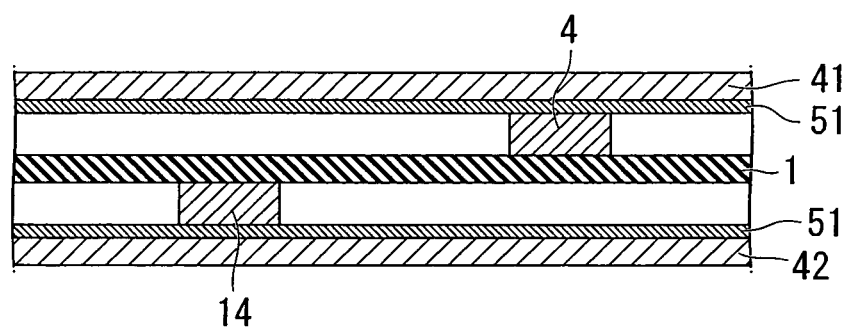
FIG. 18 is a partial cross-sectional view along the line E-E' (FIG. 16) of an inlay 40E according to the sixth embodiment of the present invention.

FIG. 18 is a cross-sectional view along the line E-E' (FIG. 16) of the inlay 40E according to the sixth embodiment of the present invention. As shown in FIG. 18, an antenna coil 4 is provided on one face of the antenna sheet 1. A jumper line 14 is provided on another face of the antenna sheet 1.

The base material 41 is arranged on the face of the antenna sheet 1 where the antenna coil 4 is provided. The base material 42 is arranged on the face of the antenna sheet 1 where the jumper line 14 is provided.

A coating of adhesive 51 is applied to the face of the base material 41 that opposes the base material 42, and to the face of the base material 42 that opposes the base material 41.

Figure 19:
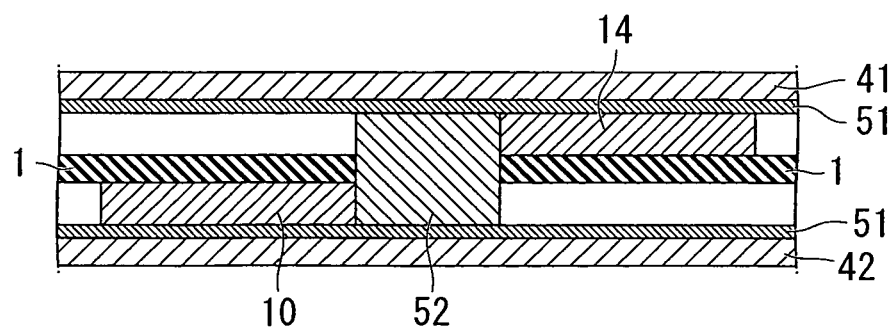
FIG. 19 is a partial cross-sectional view along the line F-F' (FIG. 16) of an inlay 40E according to the sixth embodiment of the present invention.
Figure 20:
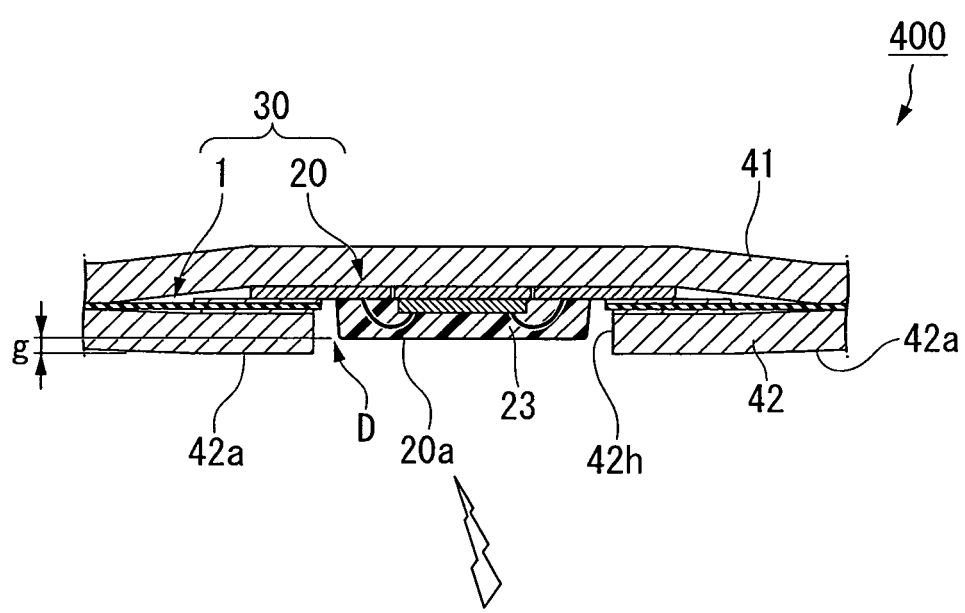
FIG. 20 is a partial cross-sectional view corresponding to FIG. 5B of a conventional inlay.

FIG. 19 is a cross-sectional view along the line F-F' (FIG. 16) of the inlay 40E according to the sixth embodiment of the present invention. The jumper line 14 is provided on one face of the antenna sheet 1. A wire 10 for connection to the antenna connecting land 9 is provided on the other face of the antenna sheet 1. The jumper line 14 and the wire 10 are electrically connected by a conductive connection section 52, which is provided in the opening of the antenna sheet 1.

An opening is formed in the antenna sheet 1, the jumper line 14 and the wire 10 being connected via this opening.

The base material 41 is arranged on the face of the antenna sheet 1 where the jumper line 14 is provided. The base material 42 is arranged on the face of the antenna sheet 1 where the wire 10 is provided.

A coating of adhesive 51 is applied to the face of the base material 41 that opposes the base material 42, and to the face of the base material 42 that opposes the base material 41.

According to the sixth embodiment of the present invention described above, since the adhesive 51 with an admixture of a chloride ion-resistant substance that suppresses permeation of chloride ions is applied to the face of the base material 41 that opposes the base material 42, and to the face of the base material 42 that opposes the base material 41, chloride ions from the outside can be prevented from infiltrating the inlay 40E, and deterioration of the metal of the antenna coil 4, the jumper line 14, the wire 10, and the like, can be prevented.

While this embodiment describes examples of forming a layer of the adhesive 51 such as to cover the antenna coil 4 (FIG. 18), forming a layer of the adhesive 51 such as to cover the IC module 20 (FIG. 17), and forming a layer of the adhesive 51 such as to cover the jumper line 14 that connects the antenna coil 4 and the IC module 20 (FIGS. 18 and 19), the configuration is not limited to these. For example, the adhesive 51 can be formed such as to cover at least one or more of the antenna coil 4, the IC module 20, and the jumper line 14. Particularly, when the adhesive 51 is formed such as to cover the jumper line 14, which is comparatively weaker than the other wire sections, it becomes possible to prevent the jumper line 14 from chloride ions, and thereby to increase the reliability of the operation of the inlay 40E.

While embodiments of the invention have been described above, the technical field of the invention is not limited to these embodiments, and can be modified in various ways without departing from the spirit or scope of the present invention.

When the antenna sheet 1 shown in FIG. 4B is pinched between a pair of base materials (third and fourth base materials) and made into a product, a storing section (an opening or a recess) having roughly the same shape as the antenna land 25 when viewed from above can be provided in the base material to be attached to the antenna land 25 side, and the antenna land 25 can be stored in this storing section. Furthermore, a storing section (an opening or a recess) having roughly the same shape as the sealing resin of the IC chip 22 when viewed from above can be provided in the base material to be attached to the opposite side to the antenna land 25 side, and the sealing resin of the IC chip 22 can be stored in this storing section.

With this configuration, when the antenna sheet 1 is pinched between the pair of base materials and made into a product, the thickness of the product can be reduced, and the antenna sheet 1 can be more reliably fixed by the pair of base materials.

For example, while in the description of the fourth embodiment, the adhesive 116 is resistant to chloride ions, the chloride ion-resistant layer can instead be formed using another chloride ion-resistant substance, such as an epoxy-based resin.

In this case, the chloride ion-resistant layer can be formed by a method such as applying a coating to the IC inlet 111, or it can be formed on the faces of the porous base materials 115 that will be joined to the IC inlet 111. In the latter case, a chloride ion-resistant layer and an adhesive can be formed on the surfaces of the porous base materials using a printing device and the like that is capable of multi-color printing. This enables the two layers to be formed efficiently without greatly modifying the process.

Figure 14A:
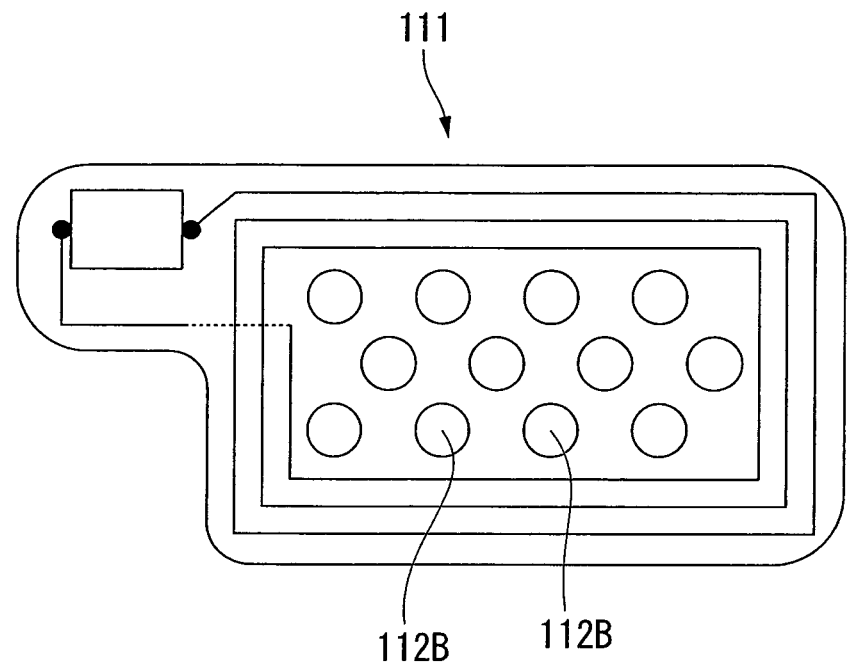
FIG. 14A is a diagram showing an IC inlet in a modification of a non-contact type information medium of the present invention.
Figure 14B:
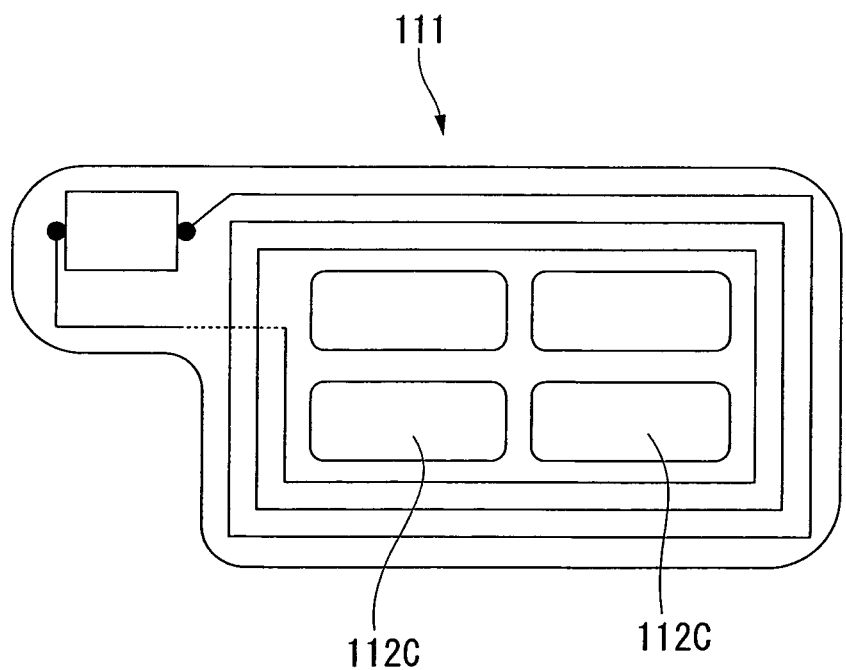
FIG. 14B is a diagram showing an IC inlet in a modification of a non-contact type information medium of the present invention.

The through hole formed in the sheet 112 is not limited to the single hole described in the embodiments. For example, a plurality of through holes 112B and 112C can be provided, as in the modifications shown in FIG. 14A and FIG. 14B. This configuration achieves a plurality of dispersed points where the porous base materials are firmly joined together, obtaining a highly secure information medium which is more difficult to peel off.

While each of the embodiments describes an example of an information medium wherein an IC inlet is pinched between porous base materials, the information medium can be configured without providing porous base materials, and with a chloride ion-resistant layer formed directly on the IC inlet. While such an information medium is slightly less smooth than one that includes porous base materials, it can be applied in a booklet by appropriately selecting an adhesive for joining it to the front cover member and the inner bonding sheet. It then becomes possible to suppress deterioration of the antenna coil and ensure the functions of the information medium, while using the booklet over a long time period.

Furthermore, the fourth and the sixth embodiments described above can be applied in any of the other embodiments. For example, the antenna coil 4 of the first to the third embodiments can be covered with the adhesive 116 which constitutes the chloride ion-resistant layer of the fourth embodiment.

It is also acceptable to coat the antenna coil 4 with an adhesive that is not resistant to chloride ions, and then cover that adhesive with a chloride ion-resistant layer.

In the fourth embodiment described above, sheet-like porous base materials 115 that pinch the antenna coil 113 such as to cover it can be provided on the entirety of both faces of the sheet 112, and the adhesive 116 which constitutes a chloride ion-resistant layer can be formed on faces of the porous base materials 115 that oppose the sheet 112. This enables the chloride ion-resistant to be easily formed; in addition, both faces of the non-contact type information medium 110 can be made flat, and, when the information medium 110 is attached to a booklet, projections and recesses are less likely to be generated on the page it is attached to.

As described above in the fourth embodiment, when the porous base materials 115 are affixed by the adhesive 116 to the sheet 112, since the adhesive 116 is resistant to chloride ions, it functions as a chloride ion-resistant layer. This makes it possible to form the chloride ion-resistant layer at the same time as affixing the porous base materials, thereby increasing the manufacturing efficiency.

As described above in the fourth embodiment, the sheet 112 includes a through hole 112A penetrating the thickness direction of the sheet 112, and the porous base materials 115 are joined at the through hole 112A without the sheet 112 in between, whereby the porous base materials 115 are joined together directly at the through hole. Therefore, the porous base materials 115 can be joined more firmly, and security can be increased.

Furthermore, as described in the fourth embodiment, the cross-sectional area in the direction that orthogonally intersects the axis line of the through hole 112A is given a value of not less than 60% of the area of the region inside the loop of the antenna coil 113; also, the area of the sheet 112 at the time of joining it to the porous base materials 115 is not less than 3% and less than 20% of the area of the porous base materials 115, whereby the porous base materials 115 can be more firmly joined.

Furthermore, as described in the fourth embodiment, since the antenna coil 113 includes aluminum, it can be formed inexpensively and reliably.

Furthermore, as described in the fourth embodiment, by applying the non-contact type information medium 110 in the booklet 101, the antenna coil 113 of the non-contact type information medium 110 attached to the booklet 101 is less likely to deteriorate, and can be used stably for a long period of time.

While the fourth embodiment describes a case where the adhesive 116 constituting a chloride ion-resistant layer is formed such as to cover the antenna coil 113, this is not limitative of the invention. For example, in addition to or instead of a chloride ion-resistant layer, a water-resistant layer can be formed such as to cover the antenna coil 113.

As the material for a water-resistant layer, it is possible to use rubber latex such as natural rubber latex and styrene butadiene copolymer latex, vinyl chloride-vinyl acetate-based resin, polyester-based resin, polyurethane-based resin, a (meta)acrylic-based resin such as (meta)acrylate-styrene acid/alkyl ester, (meta)acrylic acid/allyl ester copolymer, or an epoxy-based resin, etc.

Industrial Applicability

The present invention can be applied in an antenna sheet, a transponder, a booklet, and the like, which can prevent infiltration of static electricity, and can satisfy a demand for smooth outer surfaces.

The invention claimed is:
1. A transponder comprising:
an IC inlet;
a first base material which is flexible;
an antenna sheet which is provided above one surface of the first base material, the antenna sheet comprising an antenna coil and having a first opening, the antenna sheet being included in the IC inlet;
an IC module provided on the one surface of the first base material, the IC module being connected to the antenna coil, at least a part of the IC module being provided in the first opening, the IC module being included in the IC inlet;
a second base material which has a second opening in which a part of the IC module is provided; and
a sealing resin having a first portion which fills a first space in the second opening, the first space not including a second space at which the part of the IC module is provided, wherein:
the sealing resin has a second portion which fills a third space vertically between a first area and a second area, the first area being not all, but part of one surface of the second base material, the first area surrounding a whole circumference of an open end of the second opening, and the second area being not all, but part of one surface of the antenna sheet,
the first and second portions of the sealing resin are formed in a single piece in which a first length of the sealing resin is larger than a second length of the sealing resin,
the sealing resin is provided surrounding a side surface of a sealing resin section which seals the IC chip,
the first length is, from the side surface, along a radial direction, and the first length being at a first height at which the sealing resin contacts the second area,
the second length is, from the side surface, along the radial direction, and the second length is at a second height which is a highest in the side surface,
the first area is the same as the second area when seen along an axis which is perpendicular to the one surface of the second base material, and
a third area is included in the first area when seen along the axis which is perpendicular to the one surface of the second base material, the third area being a part of the one surface of the first base material, the third area being an area on which the IC module is provided.
2. The transponder according to claim 1, wherein the first portion of the sealing resin covers the outer surface of the IC module, and an outer surface of the second base material and an outer surface of the first portion of the sealing resin are continuous and roughly flat.
3. The transponder according to claim 2, wherein a step between the outer surface of the second base material and the outer surface of the first portion of the sealing resin is no larger than 20 μm.
4. The transponder according to claim 1, wherein the sealing resin covers a connection section between the antenna coil and the IC module, and a jumper line that connects the antenna coil to the IC module.
5. The transponder according to claim 1, wherein the longitudinal elastic modulus of the sealing resin is less than the longitudinal elastic modulus of the sealing resin section, and
wherein the at least a part of the IC module is the sealing resin section.
6. The transponder according to claim 1, wherein the sealing resin is a resin tape comprising a sticky material.
7. The transponder according to claim 6, wherein the longitudinal elastic modulus of the sticky material is less than the longitudinal elastic modulus of a sealing resin section which seals the IC chip.
8. The transponder according to claim 1, wherein the first base material is a cover material.
9. The transponder according to claim 1, wherein a cover is joined to another surface of the first base material.
10. The transponder according to claim 1, wherein the antenna sheet is made of the same material as the sealing resin.
11. The transponder according to claim 1, further comprising a chloride ion-resistant layer which covers at least one or more of the antenna coil, the IC module, and a jumper line that connects the antenna coil to the IC module.
12. The transponder according to claim 1, further comprising a water-resistant layer which covers at least one or more of the antenna coil, the IC module, and a jumper line that connects the antenna coil to the IC module.
13. The transponder according to claim 1, wherein the first base material has a third opening provided at a region corresponding to an inside region where a lead frame of the IC module is provided.
14. The transponder according to claim 13, wherein an area of the third opening is larger than an area of the second opening.
15. The transponder according to claim 1, wherein the antenna sheet has a fourth opening provided at a region corresponding to an inside region where a loop of the antenna coil is provided.
16. The transponder according to claim 1, wherein
the second opening is a through hole configured to penetrate the second base material, and
another base material is not provided on another surface of the second base material, the another surface of the second base material being an opposite surface of the one surface of the second base material.
17. The transponder according to claim 1, wherein
the first base material does not have an opening in which the IC module is provided.
18. A booklet comprising a transponder, the transponder comprising:
an IC inlet;
a first base material which is flexible;
an antenna sheet which is provided above one surface of the first base material, the antenna sheet comprising an antenna coil and having a first opening, the antenna sheet being included in the IC inlet;
an IC module provided on the one surface of the first base material, the IC module being connected to the antenna coil, at least a part of the IC module being provided in the first opening, the IC module being included in the IC inlet;
a second base material which has a second opening in which a part of the IC module is provided; and
a sealing resin having a first portion which fills a first space in the second opening, the first space not including a second space at which the part of the IC module is provided, wherein:
the sealing resin has a second portion which fills a third space vertically between a first area and a second area, the first area being not all, but part of one surface of the second base material, the first area surrounding a whole circumference of an open end of the second opening, and the second area being not all, but part of one surface of the antenna sheet, the first and second portions of the sealing resin are formed in a single piece in which a first length of the sealing resin is larger than a second length of the sealing resin, the sealing resin is provided surrounding a side surface of a sealing resin section which seals the IC chip, the first length is, from the side surface, along a radial direction, and the first length being at a first height at which the sealing resin contacts the second area, the second length is, from the side surface, along the radial direction, and the second length is at a second height which is a highest in the side surface, the first area is the same as the second area when seen along an axis which is perpendicular to the one surface of the second base material, and a third area is included in the first area when seen along the axis which is perpendicular to the one surface of the second base material, the third area being a part of the one surface of the first base material, the third area being an area on which the IC module is provided.

19. A transponder comprising:

an IC inlet;

a first base material which is flexible;

an antenna sheet which is provided above one surface of the first base material, the antenna sheet having a first opening and comprising an antenna coil and an antenna land, the antenna sheet being included in the IC inlet;

an IC module provided on the one surface of the first base material, the IC module being connected to the antenna coil via the antenna land, the IC module comprising a lead frame, and an IC chip mounted on the lead frame, at least a part of the IC module being provided in the first opening, the IC module being included in the IC inlet;

a second base material which has a second opening in which a part of the IC module is provided; and a sealing resin having a first portion which fills a first space in the second opening, the first space not including a second space at which the part of the IC module is provided, wherein:

the sealing resin has a second portion which fills a third space vertically between a first area and a second area, the first area being not all, but part of one surface of the second base material surrounding a whole circumference of an open end of the second opening, and the second area being not all, but part of one surface of the antenna sheet, the sealing resin being at least coextensive with an area of the antenna land, the sealing resin having electrical insulation characteristics, the first and second portions of the sealing resin are formed in a single piece in which a first length of the sealing resin is larger than a second length of the sealing resin, the sealing resin is provided surrounding a side surface of a sealing resin section which seals the IC chip, the first length is, from the side surface, along a radial direction, and the first length is at a first height at which the sealing resin contacts the second area, the second length is, from the side surface, along the radial direction, and the second length is at a second height which is a highest in the side surface, the first area is the same as the second area when seen along an axis which is perpendicular to the one surface of the second base material, and a third area is included in the first area when seen along the axis which is perpendicular to the one surface of the second base material, the third area being a part of the one surface of the first base material, the third area being an area on which the IC module is provided.

20. The transponder according to claim 19, wherein the second base material has a recess, the second portion of the sealing resin being between a portion of the second base material and a portion of the antenna sheet.

\* \* \* \* \*